United States Patent
Tseng et al.

(10) Patent No.: US 10,037,893 B1
(45) Date of Patent: Jul. 31, 2018

(54) METHOD AND APPARATUS FOR ETCHING WAFER WITH ETCHING GAS

(71) Applicant: Taiwan Semiconductor Manufacturing Co., Ltd., Hsinchu (TW)

(72) Inventors: Lee-Chuan Tseng, New Taipei (TW); Chang-Ming Wu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/464,541

(22) Filed: Mar. 21, 2017

(51) Int. Cl.
*H01L 21/31* (2006.01)
*H01L 21/311* (2006.01)
*H01L 21/67* (2006.01)
*H01L 21/677* (2006.01)

(52) U.S. Cl.
CPC .. *H01L 21/31116* (2013.01); *H01L 21/67069* (2013.01); *H01L 21/67739* (2013.01)

(58) Field of Classification Search
CPC ......... H01L 21/31116; H01L 21/67739; H01L 21/67069
See application file for complete search history.

*Primary Examiner* — Nadine Norton
*Assistant Examiner* — Mahmoud Dahimene
(74) *Attorney, Agent, or Firm* — McClure, Qualey & Rodack, LLP

(57) ABSTRACT

A method and apparatus for etching a wafer are provided. The method includes placing a first wafer with a first target material into a first chamber, and placing a second wafer with a second target material into a second chamber. The second chamber is connected to the first chamber by a first pipe. The method also includes applying a first Xe-containing gaseous etchant into the first chamber to etch the first target material. A portion of the first Xe-containing gaseous etchant in the first chamber is unreacted during the etching of the first target material. The method further includes applying the unreacted portion of the first Xe-containing gaseous etchant from the first chamber into the second chamber through the first pipe to etch the second target material of the second wafer.

20 Claims, 27 Drawing Sheets

METHOD AND APPARATUS FOR ETCHING WAFER WITH ETCHING GAS

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, the manufacturing cost of fabrication processes continues to increase. The fabrication processes are etching processes, photolithography processes, alignment processes, gap-filling processes, or the like. Therefore, it is a challenge to form semiconductor device structures with smaller and smaller sizes using cost-effective fabrication processes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
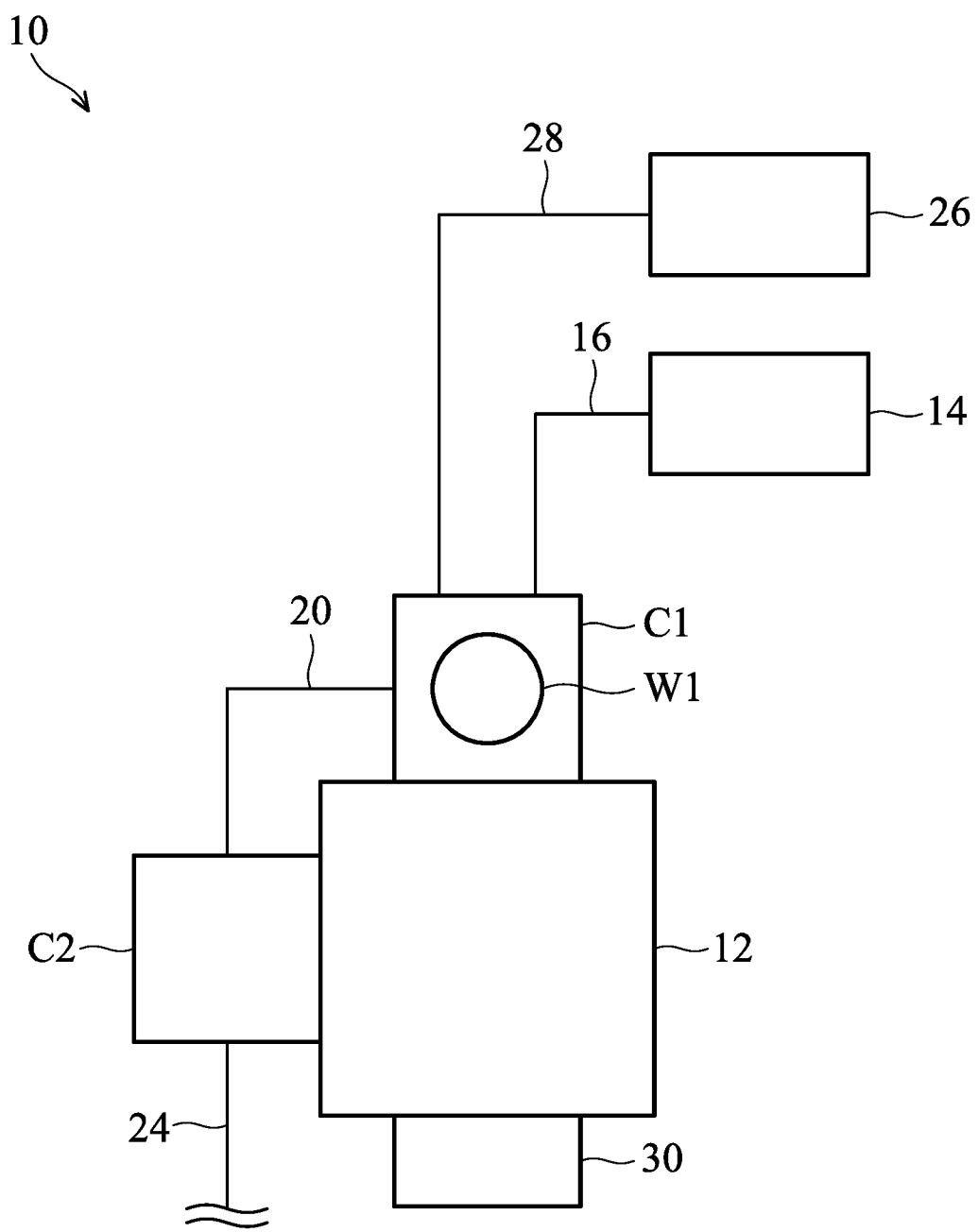
FIGS. 1A-1C are top views of various stages of a process for etching a wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity.

Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
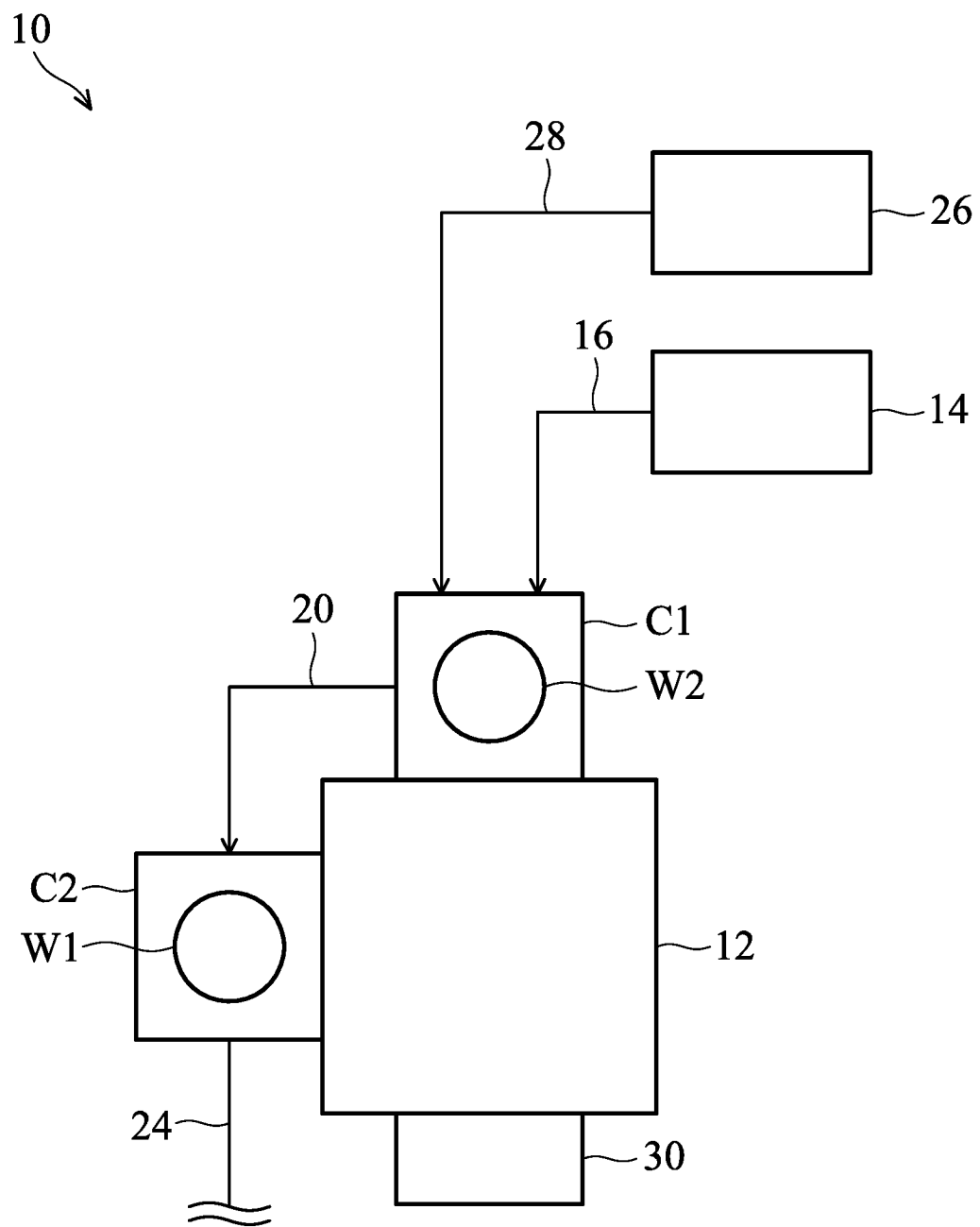
Figure 1C:
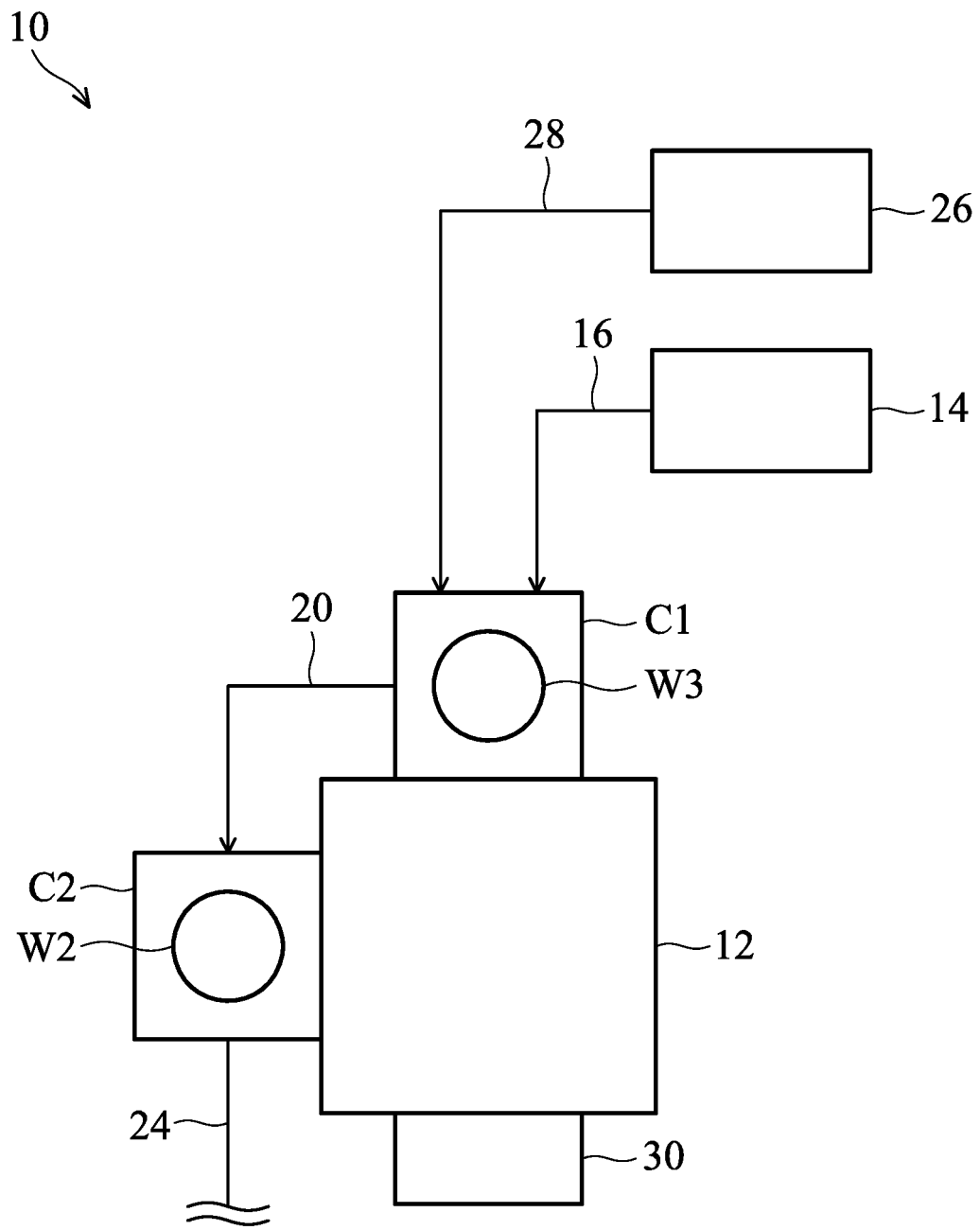
Figure 2A:
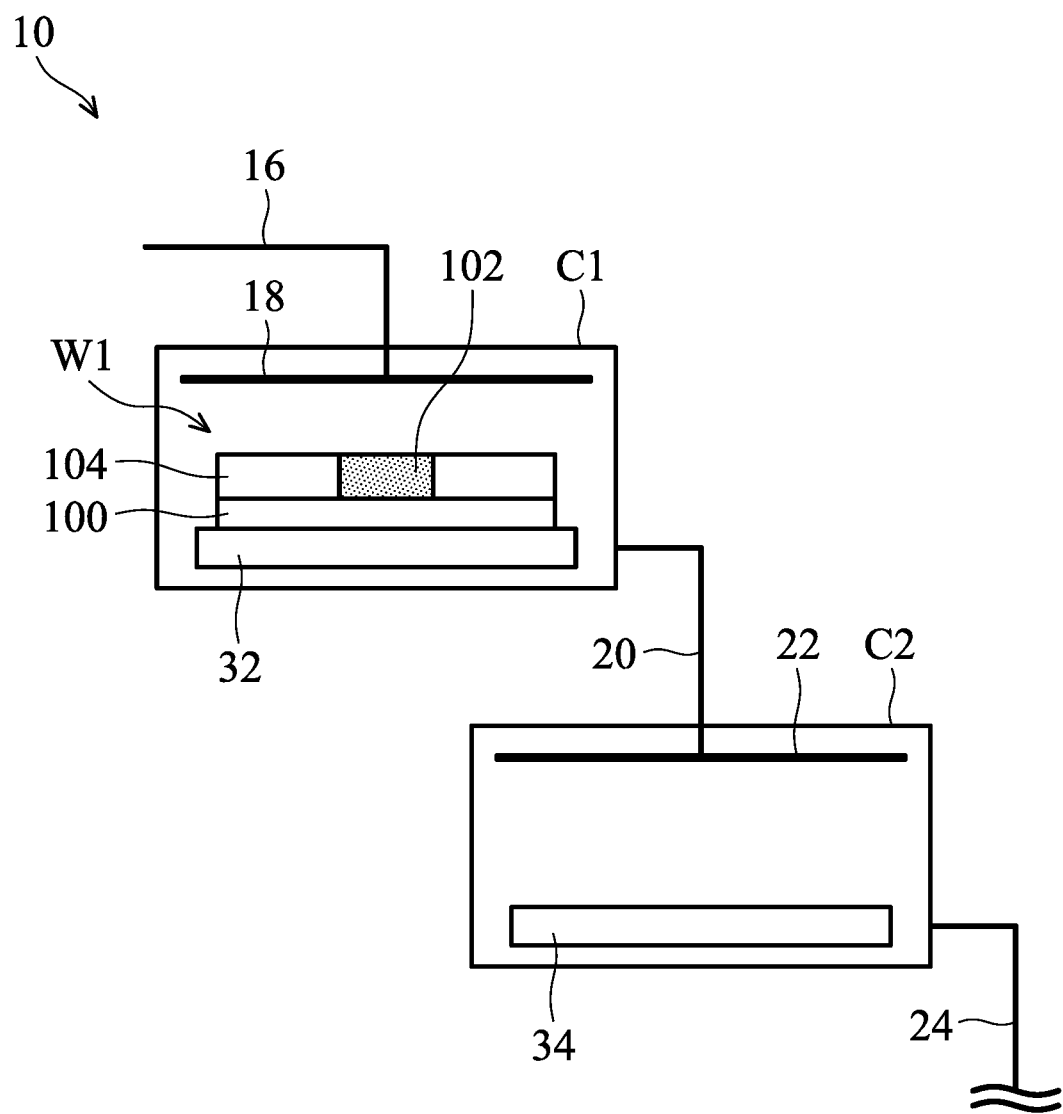
FIGS. 2A-2F are cross-sectional views of various stages of a process for etching a wafer, in accordance with some embodiments.

FIGS. 1A-1C are top views of various stages of a process for etching a wafer, in accordance with some embodiments. FIGS. 2A-2F are cross-sectional views of various stages of a process for etching a wafer corresponding to FIGS. 1A-1C, in accordance with some embodiments. As shown in FIGS. 1A and 2A, an apparatus 10 is provided, in accordance with some embodiments. As shown in FIGS. 1A and 2A, the apparatus 10 includes a transfer port 12, a first chamber C1, and a second chamber C2, in accordance with some embodiments. As shown in FIGS. 1A and 2A, the first chamber C1 and the second chamber C2 are connected to the transfer port 12, and the transfer port 12 is configured to transfer wafers between the first chamber C1 and the second chamber C2, in accordance with some embodiments. In some embodiments, the transfer port 12 is also referred to as a transfer unit or a transfer device.

As shown in FIGS. 1A and 2A, the apparatus 10 further includes a first container 14, in accordance with some embodiments. In some embodiments, the first container 14 is configured to contain an etching gas which contains Xe-containing gaseous etchant. As shown in FIGS. 1A and 2A, the apparatus 10 further includes an inlet 16 connecting the first container 14 to the first chamber C1, in accordance with some embodiments. As shown in FIG. 2A, the inlet 16 is connected to a dispensing head 18 in the first chamber C1, in accordance with some embodiments.

As shown in FIGS. 1A and 2A, the apparatus 10 further includes a pipe 20 connecting the first chamber C1 to the second chamber C2, in accordance with some embodiments. As shown in FIG. 2A, the pipe 20 is connected to a dispensing head 22 in the second chamber C2, in accordance with some embodiments. As shown in FIGS. 1A and 2A, the apparatus 10 further includes an outlet 24 connecting to the second chamber C2, in accordance with some embodiments.

In some embodiments, the inlet 16 is configured to receive an etching gas with a first concentration from the first container 14 and provide the etching gas into the first chamber C1. In some embodiments, the pipe 20 is configured to output the etching gas with a second concentration that is lower than the first concentration from the first chamber C1 into the second chamber C2. In some embodiments, the outlet 24 is configured to output the etching gas from the second chamber C2.

It should be understood that, although the terms first, second, third etc. may be used herein to describe various concentration, elements, components, regions, layers, portions and/or sections, these concentration, elements, components, regions, layers, portions and/or sections should not be limited by these terms. These terms are only used to distinguish one concentration, element, component, region, layer, portion or section from another concentration, element, component, region, layer or section. Therefore, a first concentration, element, component, region, layer, portion or section discussed above could be termed a second concentration, element, component, region, layer, portion or section without departing from the teachings of the present disclosure.

As shown in FIGS. 1A and 2A, the apparatus 10 further includes a second container 26 connecting to the first chamber C1 by a pipe 28, in accordance with some embodiments. In some embodiments, the second container 26 is configured to contain an inert gas. In some embodiments, the inert gas includes nitrogen, helium, neon, argon, krypton, another suitable inert gas, or a combination thereof. In some embodiments, the pipe 28 is configured to receive the inert gas from the second container 26 and provide the inert gas into the first chamber C1.

As shown in FIGS. 1A and 2A, the apparatus 10 further includes a load port 30 positioned adjacent to the transfer port 12, in accordance with some embodiments. In some embodiments, the load port 30 is configured to transfer the wafers into the transfer port 12.

As shown in FIGS. 1A and 2A, a first wafer W1 is placed into the first chamber C1 and positioned over a chuck 32 in the first chamber C1, in accordance with some embodiments. As shown in FIG. 2A, the first wafer W1 includes a semiconductor substrate 100, a first target material 102 over the semiconductor substrate 100, and a layer 104 over the semiconductor substrate 100 and surrounding the first target material 102, in accordance with some embodiments. However, the embodiments of the present disclosure are not limited thereto. In some other embodiments of the present disclosure, the first target material 102 can be formed at any other position in the first wafer W1 as long as the first target material 102 is exposed and can be etched in a subsequent stage.

In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 100 is an un-doped substrate. However, in some other embodiments, the semiconductor substrate 100 is a doped substrate such as a P-type substrate or an N-type substrate.

In some embodiments, the semiconductor substrate 100 includes various doped regions (not shown) depending on design requirements of the semiconductor device structure. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, an interconnection structure is formed in the semiconductor substrate 100. The interconnection structure also includes multiple conductive features formed in the interlayer dielectric layers. The conductive features may include conductive lines, conductive vias, and/or conductive contacts. In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

The device elements are interconnected through the interconnection structure in the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof. In some embodiments, the first wafer W1 is used to manufacture a microphone or a RF MEMS device.

In some embodiments, the first target material 102 can be etched by a Xe-containing gaseous etchant. In some embodiments, the first target material 102 is made of poly-silicon, monolithic silicon, amorphous silicon, another suitable material, or a combination thereof. In some embodiments, the layer 104 cannot be etched by a Xe-containing gaseous etchant. In some embodiments, the layer 104 is made of a metal, a dielectric material, a semiconductor material other than silicon, another suitable material, or a combination thereof.

Figure 2B:
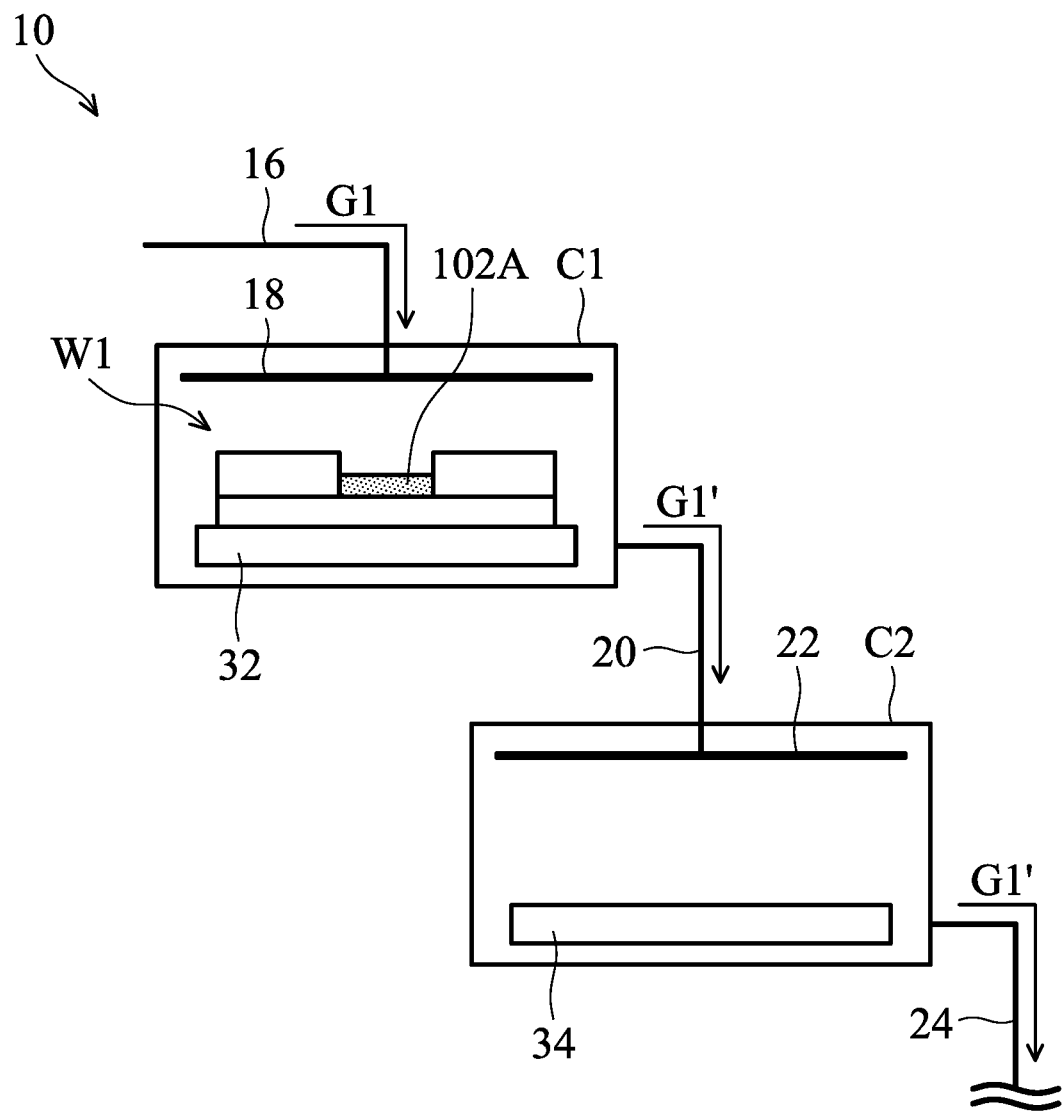

As shown in FIGS. 1A and 2B, a first etching gas G1 is applied or provided from the first container 14 into the first chamber C1 to etch the first target material 102 of the first wafer W1, in accordance with some embodiments. In some embodiments, the first etching gas G1 contains a Xe-containing gaseous etchant. In some embodiments, the Xe-containing gaseous etchant includes gaseous $XeF_2$, the gaseous $XeF_4$, the gaseous $XeF_6$, another suitable Xe-containing gaseous etchant, or a combination thereof. In some embodiments, the first etching gas G1 has a first concentration of the Xe-containing gaseous etchant. In some embodiments, the first concentration is about 100 weight percent and the first etching gas G1 is substantially pure Xe-containing gaseous etchant.

As shown in FIGS. 1A and 2B, the first etching gas G1 (or the Xe-containing gaseous etchant in the first etching gas G1) etches the first target material 102 and leaves a remaining portion 102A of the first target material 102, in accordance with some embodiments. In some embodiments, a portion of the first etching gas G1 is reacted with the first target material 102 to produce a byproduct gas such as a gaseous xenon element and gaseous silicon tetrafluoride. In some embodiments, another portion of the first etching gas G1 is unreacted and is referred to as an unreacted portion of the first etching gas G1. Specifically, in some embodiments, a portion of the Xe-containing gaseous etchant in the first etching gas G1 is reacted with the first target material 102. In some embodiments, another portion of the Xe-containing gaseous etchant in the first etching gas G1 is unreacted. In some embodiments, the unreacted portion of the first etching gas G1 includes the unreacted portion of Xe-containing gaseous etchant in the first chamber C1. In some embodiments, the unreacted portion of the first etching gas G1 is the unreacted portion of Xe-containing gaseous etchant.

In some embodiments, the unreacted portion of the first etching gas G1 and the byproduct gas collectively form a gas G1' and is exhausted through the pipe 20, the second chamber C2 and the outlet 24.

Afterwards, in some embodiments, the application of the first etching gas G1 is stopped, and an inert gas is applied from the second container 26 into the first chamber C1 through the pipe 28. In some embodiments, the inert gas flows through the first chamber C1, the pipe 20, the second chamber C2 and the outlet 24 to discharge the first etching gas G1 and the gas G1' remaining in the first chamber C1 and the second chamber C2.

Figure 2C:
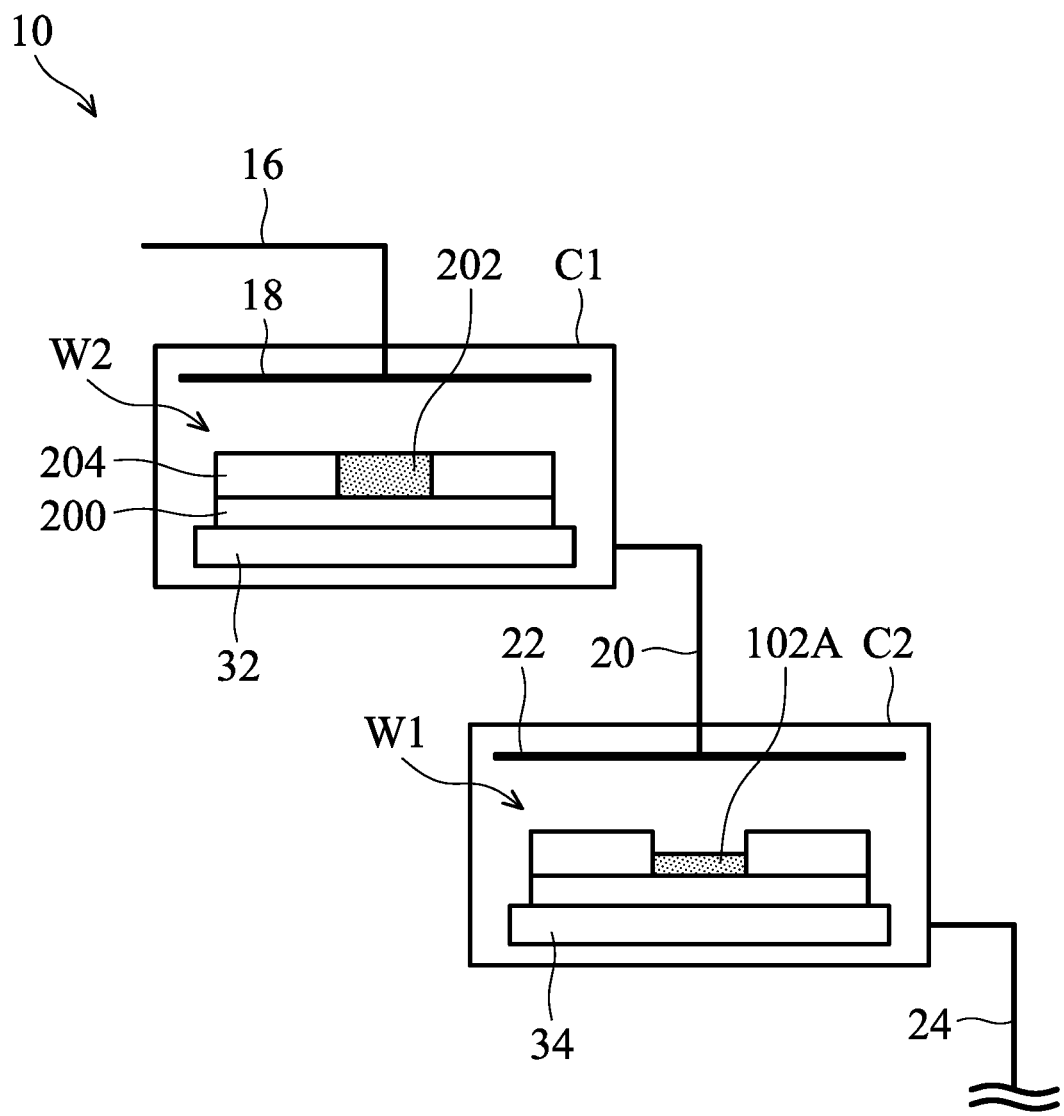

Afterwards, as shown in FIGS. 1B and 2C, the first wafer W1 with the remaining portion 102A is transferred from the first chamber C1 into the second chamber C2 through the transfer port 12, in accordance with some embodiments. As shown in FIGS. 1B and 2C, the first wafer W1 is positioned over a chuck 34 in the second chamber C2, in accordance with some embodiments.

As shown in FIGS. 1B and 2C, a second wafer W2 is placed into the first chamber C1 and positioned over the chuck 32 in the first chamber C1, in accordance with some embodiments. As shown in FIG. 2C, the second wafer W2 includes a semiconductor substrate 200, a second target material 202 over the semiconductor substrate 200, and a layer 204 over the semiconductor substrate 200 and surrounding the second target material 202, in accordance with some embodiments. However, the embodiments of the present disclosure are not limited thereto. In some other embodiments of the present disclosure, the second target material 202 can be formed at any other position in the second wafer W2 as long as the second target material 202 is exposed and can be etched in a subsequent stage.

In some embodiments, the material of the semiconductor substrate 200 is the same as or similar to the material of the semiconductor substrate 100. In some embodiments, the material of the second target material 202 is the same as or similar to the material of the first target material 102. In some embodiments, the material of the layer 204 is the same as or similar to the material of the layer 104. Therefore, a description of the materials of the semiconductor substrate 200, the second target material 202, and the layer 204 will not be repeated for the sake of brevity.

Figure 2D:
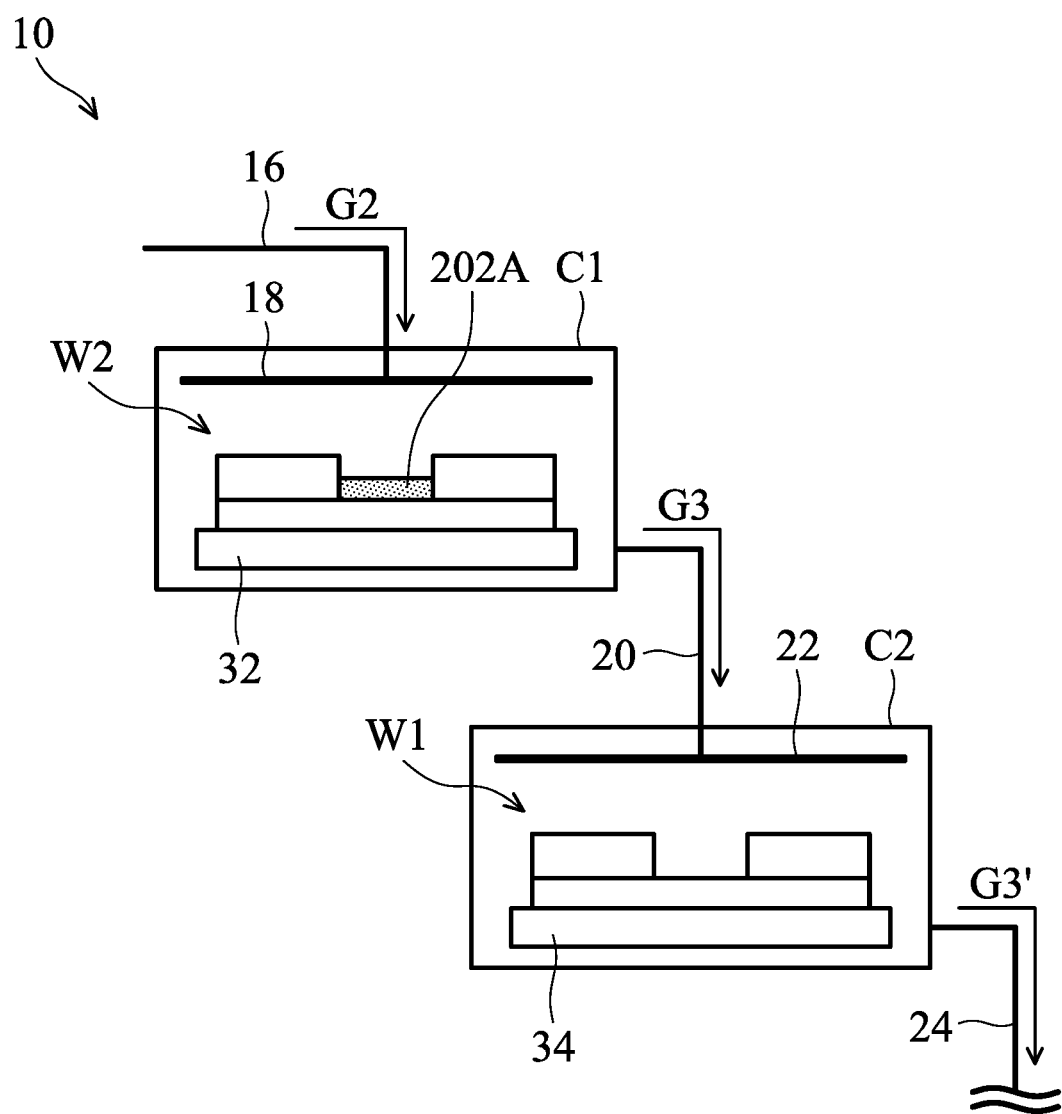

Afterwards, as shown in FIGS. 1B and 2D, a second etching gas G2 is applied from the first container 14 into the first chamber C1 to etch the second target material 202 of the second wafer W2, in accordance with some embodiments. In some embodiments, the second etching gas G2 contains the Xe-containing gaseous etchant. In some embodiments, the Xe-containing gaseous etchant includes gaseous $XeF_2$, the gaseous $XeF_4$, the gaseous $XeF_6$, another suitable Xe-containing gaseous etchant, or a combination thereof. In some embodiments, the second etching gas G2 has a second concentration of the Xe-containing gaseous etchant. In some embodiments, the second concentration is about 100 weight percent and the second etching gas G2 is substantially pure Xe-containing gaseous etchant.

In some embodiments, the material of the Xe-containing gaseous etchant in the second etching gas G2 is the same as that of the Xe-containing gaseous etchant in the first etching gas G1. In some embodiments, the component of the second etching gas G2 is the same as that of the first etching gas G1.

As shown in FIGS. 1B and 2D, the second etching gas G2 (or the Xe-containing gaseous etchant in the second etching gas G2) etches the second target material 202 and leaves a remaining portion 202A of the second target material 202, in accordance with some embodiments.

In some embodiments, a portion of the second etching gas G2 is reacted with the second target material 202 to produce a first byproduct gas. In some embodiments, another portion of the second etching gas G2 is unreacted and is referred to as an unreacted portion of the second etching gas G2. In some embodiments, the first byproduct gas includes a gaseous xenon element and gaseous silicon tetrafluoride. Specifically, in some embodiments, a portion of the Xe-containing gaseous etchant in the second etching gas G2 is reacted with the second target material 202. In some embodiments, another portion of the Xe-containing gaseous etchant in the second etching gas G2 is unreacted. In some embodiments, the unreacted portion of the second etching gas G2 includes the unreacted portion of Xe-containing gaseous etchant in the first chamber C1. In some embodiments, the unreacted portion of the second etching gas G2 is the unreacted portion of Xe-containing gaseous etchant.

In some embodiments, the unreacted portion of the second etching gas G2 and the first byproduct gas collectively form a third etching gas G3 with a third concentration of the Xe-containing gaseous etchant which is lower than the second concentration. As shown in FIG. 2D, the third etching gas G3 (i.e. The unreacted portion of the second etching gas G2 and the first byproduct gas) is applied from the first chamber C1 into the second chamber C2 through the pipe 20 to etch and remove the remaining portion 102A of the first wafer W1, in accordance with some embodiments.

In some embodiments, after etching and removing the remaining portion 102A of the first wafer W1, a gas G3' is formed and is exhausted through the outlet 24. In some embodiments, a portion of the third etching gas G3 is reacted with the remaining portion 102A to produce a byproduct gas, whereas another portion of the third etching gas G3 is unreacted. In some embodiments, the gas G3' is formed by the unreacted portion of the third etching gas G3 and the byproduct gas.

Afterwards, in some embodiments, the application of the second etching gas G2 is stopped, and an inert gas is applied from the second container 26 into the first chamber C1 and the second chamber C2 to discharge the second etching gas G2, the third etching gas G3 and the gas G3' remaining in the first chamber C1 and the second chamber C2.

Figure 2E:
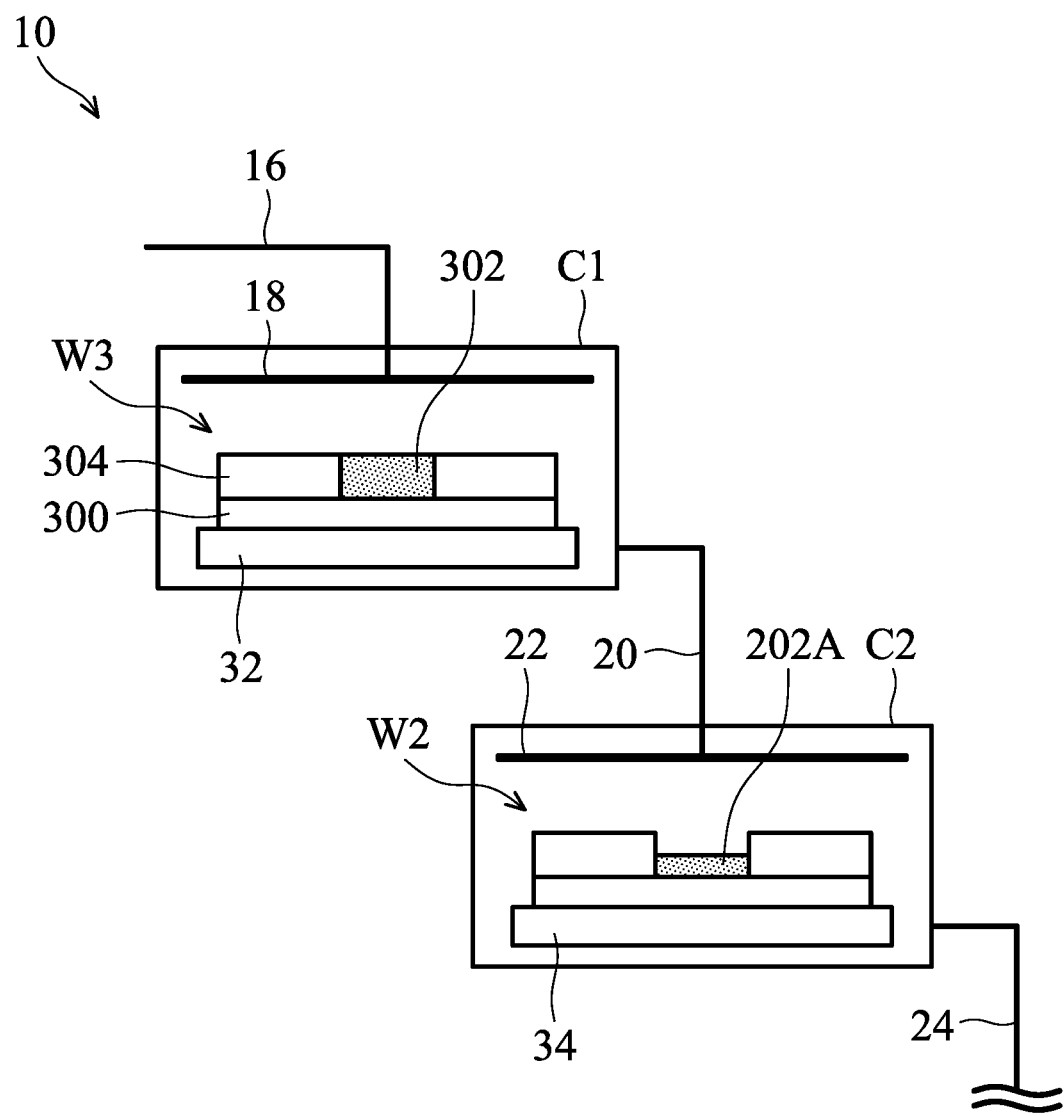

Afterwards, as shown in FIGS. 1C and 2E, the first wafer W1 is transferred out of the second chamber C2, in accordance with some embodiments. As shown in FIGS. 1C and 2E, the second wafer W2 with the remaining portion 202A is transferred from the first chamber C1 into the second chamber C2 through the transfer port 12, in accordance with some embodiments. As shown in FIGS. 1C and 2E, the second wafer W2 is positioned over the chuck 34 in the second chamber C2, in accordance with some embodiments.

As shown in FIGS. 1C and 2E, a third wafer W3 is placed into the first chamber C1 and positioned over the chuck 32 in the first chamber C1, in accordance with some embodiments. As shown in FIG. 2E, the third wafer W3 includes a semiconductor substrate 300, a third target material 302 over the semiconductor substrate 300, and a layer 304 over the semiconductor substrate 300 and surrounding the third target material 302, in accordance with some embodiments. However, the embodiments of the present disclosure are not limited thereto. In some other embodiments of the present disclosure, the third target material 302 can be formed at any other position in the third wafer W3 as long as the third target material 302 is exposed and can be etched in a subsequent stage.

In some embodiments, the material of the semiconductor substrate 300 is the same as or similar to the material of the semiconductor substrate 100. In some embodiments, the material of the third target material 302 is the same as or similar to the material of the first target material 102. In some embodiments, the material of the layer 304 is the same as or similar to the material of the layer 104. Therefore, a description of the materials of the semiconductor substrate 300, the third target material 302, and the layer 304 will not be repeated for the sake of brevity.

Figure 2F:
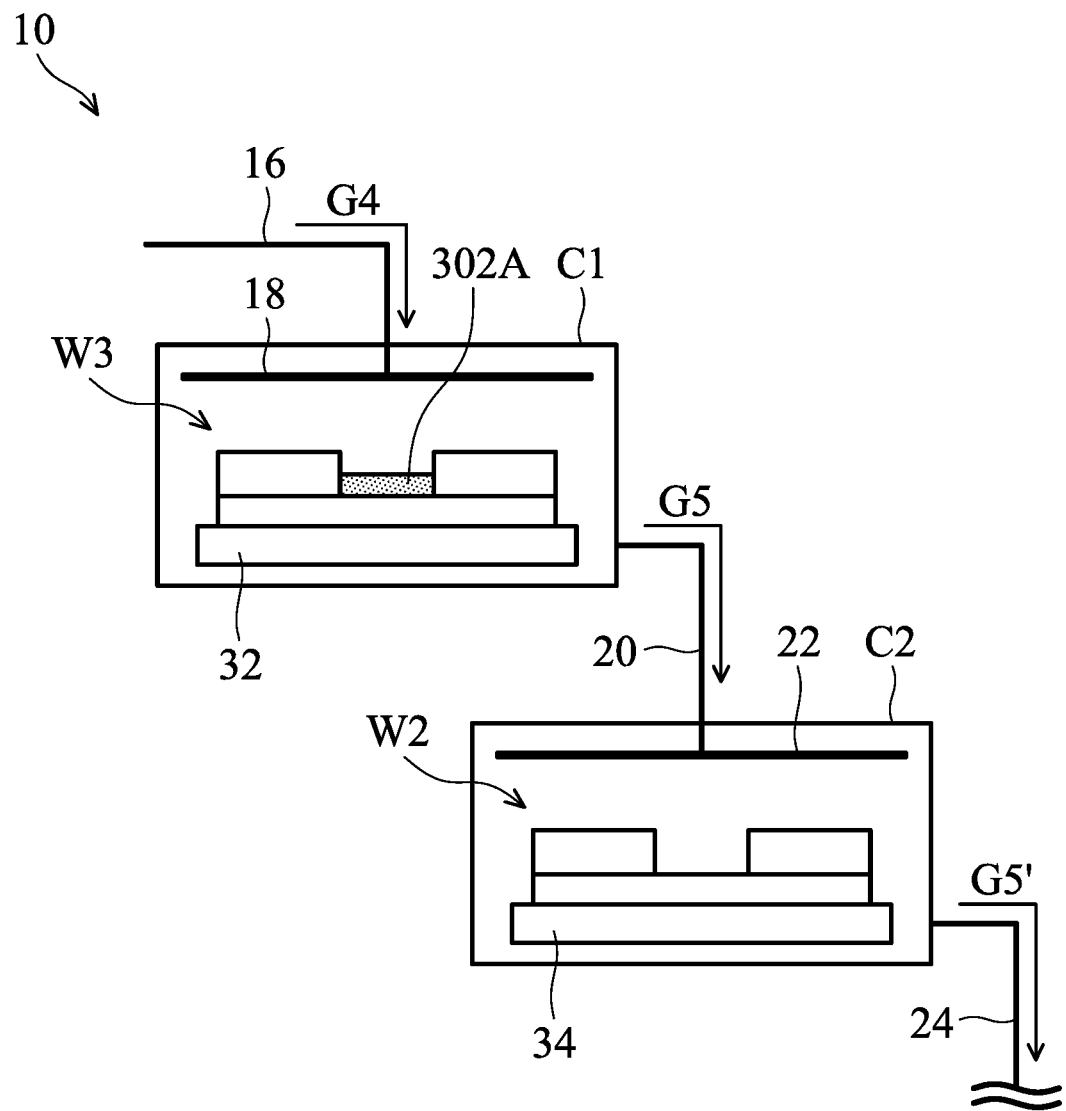

Afterwards, as shown in FIGS. 1C and 2F, a fourth etching gas G4 is applied from the first container 14 into the first chamber C1 to etch the third target material 302 of the third wafer W3, in accordance with some embodiments. In some embodiments, the fourth etching gas G4 contains the Xe-containing gaseous etchant. In some embodiments, the Xe-containing gaseous etchant includes gaseous $XeF_2$, the gaseous $XeF_4$, the gaseous $XeF_6$, another suitable Xe-containing gaseous etchant, or a combination thereof. In some embodiments, the fourth etching gas G4 has a fourth concentration of the Xe-containing gaseous etchant. In some embodiments, the fourth concentration is about 100 weight percent and the fourth etching gas G4 is substantially pure Xe-containing gaseous etchant.

In some embodiments, the material of the Xe-containing gaseous etchant in the fourth etching gas G4 is the same as that of the Xe-containing gaseous etchant in the first etching gas G1. In some embodiments, the component of the fourth etching gas G4 is the same as that of the first etching gas G1.

As shown in FIGS. 1C and 2F, the fourth etching gas G4 (or the Xe-containing gaseous etchant in the fourth etching gas G4) etches the third target material 302 and leaves a remaining portion 302A of the third target material 302, in accordance with some embodiments.

In some embodiments, a portion of the fourth etching gas G4 is reacted with the third target material 302 to produce a second byproduct gas. In some embodiments, another portion of the fourth etching gas G4 is unreacted and is referred to as an unreacted portion of the fourth etching gas G4. In some embodiments, the second byproduct gas includes a gaseous xenon element and gaseous silicon tetrafluoride. Specifically, in some embodiments, a portion of the Xe-containing gaseous etchant in the fourth etching gas G4 is reacted with the third target material 302. In some embodiments, another portion of the Xe-containing gaseous etchant in the fourth etching gas G4 is unreacted. In some embodiments, the unreacted portion of the fourth etching gas G4 includes the unreacted portion of Xe-containing gaseous etchant in the first chamber C1. In some embodiments, the unreacted portion of the fourth etching gas G4 is the unreacted portion of Xe-containing gaseous etchant.

In some embodiments, the unreacted portion of the fourth etching gas G4 and the second byproduct gas collectively form a fifth etching gas G5 with a fifth concentration of the Xe-containing gaseous etchant which is lower than the fourth concentration. As shown in FIG. 2F, the fifth etching gas G5 (i.e. The unreacted portion of the fourth etching gas G4 and the second byproduct gas) is applied from the first chamber C1 into the second chamber C2 through the pipe 20 to etch and remove the remaining portion 202A of the second wafer W2, in accordance with some embodiments.

In some embodiments, after etching and removing the remaining portion 202A of the second wafer W2, a gas G5' is formed and is exhausted through the outlet 24. In some embodiments, a portion of the fifth etching gas G5 is reacted with the remaining portion 202A to produce a byproduct gas, whereas another portion of the fifth etching gas G5 is unreacted. In some embodiments, the gas G5' is formed by the unreacted portion of the fifth etching gas G5 and the byproduct gas.

Afterwards, in some embodiments, the application of the fourth etching gas G4 is stopped, and an inert gas is applied from the second container 26 into the first chamber C1 and the second chamber C2 to discharge the fourth etching gas G4, the fifth etching gas G5 and the gas G5' remaining in the first chamber C1 and the second chamber C2.

Afterwards, in some embodiments, the processes mentioned above are repeated to etch other wafers, and the description will not be repeated for the sake of brevity.

In some cases, the apparatus includes only one chamber (for example, the first chamber) for etching wafers. In these cases, the unreacted portion of the Xe-containing gaseous etchant in the chamber is directly exhausted and is wasted.

In some embodiments, the apparatus of the present disclosure includes two or more chambers (for example, the first chamber and the second chamber) for etching wafers. In some embodiments, the unreacted portion of the Xe-containing gaseous etchant in the first chamber can be used to etch the wafer in the second chamber instead of being directly exhausted. Therefore, the utilization efficiency of the Xe-containing gaseous etchant may be improved, and the amount of wafer manufactured per hour may also be increased. In addition, the manufacturing cost may be reduced.

The embodiments of the present disclosure are not limited thereto. In some other embodiments of the present disclosure, in the stage shown in FIG. 1A, the second wafer W2 is placed in the second chamber C2. Therefore, in the etching process shown in FIG. 2B, the unreacted portion of the Xe-containing gaseous etchant in the first chamber C1 can be used to etch the second wafer W2 placed in the second chamber C2. Therefore, the utilization efficiency of the Xe-containing gaseous etchant may be improved further, and the manufacturing cost may be reduced further.

It should be noted that the exemplary embodiment set forth in FIGS. 1A-1C and 2A-2F is merely for the purpose of illustration. In addition to the embodiment set forth in FIGS. 1A-1C and 2A-2F, the wafers may be transferred by another sequence as shown in FIGS. 3A-3C and 4A-4F. This will be described in more detail in the following description. Therefore, the present disclosure is not limited to the exemplary embodiment shown in FIGS. 1A-1C and 2A-2F.

It should be understood that, although the terms first, second, third etc. may be used herein to describe various etching gases, various elements, components, regions, layers, portions and/or sections, these etching gases, elements, components, regions, layers, portions and/or sections should not be limited by these terms. These terms are only used to distinguish one etching gas, element, component, region, layer, portion or section from another etching gas, element, component, region, layer or section. Therefore, a first etching gas, element, component, region, layer, portion or section discussed above could be termed a second etching gas, element, component, region, layer, portion or section without departing from the teachings of the present disclosure. In addition, the drawings of different embodiments may use like and/or corresponding numerals to denote like and/or corresponding etching gases or elements in order to clearly describe the present disclosure. However, the use of like and/or corresponding numerals in the drawings of different embodiments does not suggest any correlation between different embodiments.

Figure 3A:
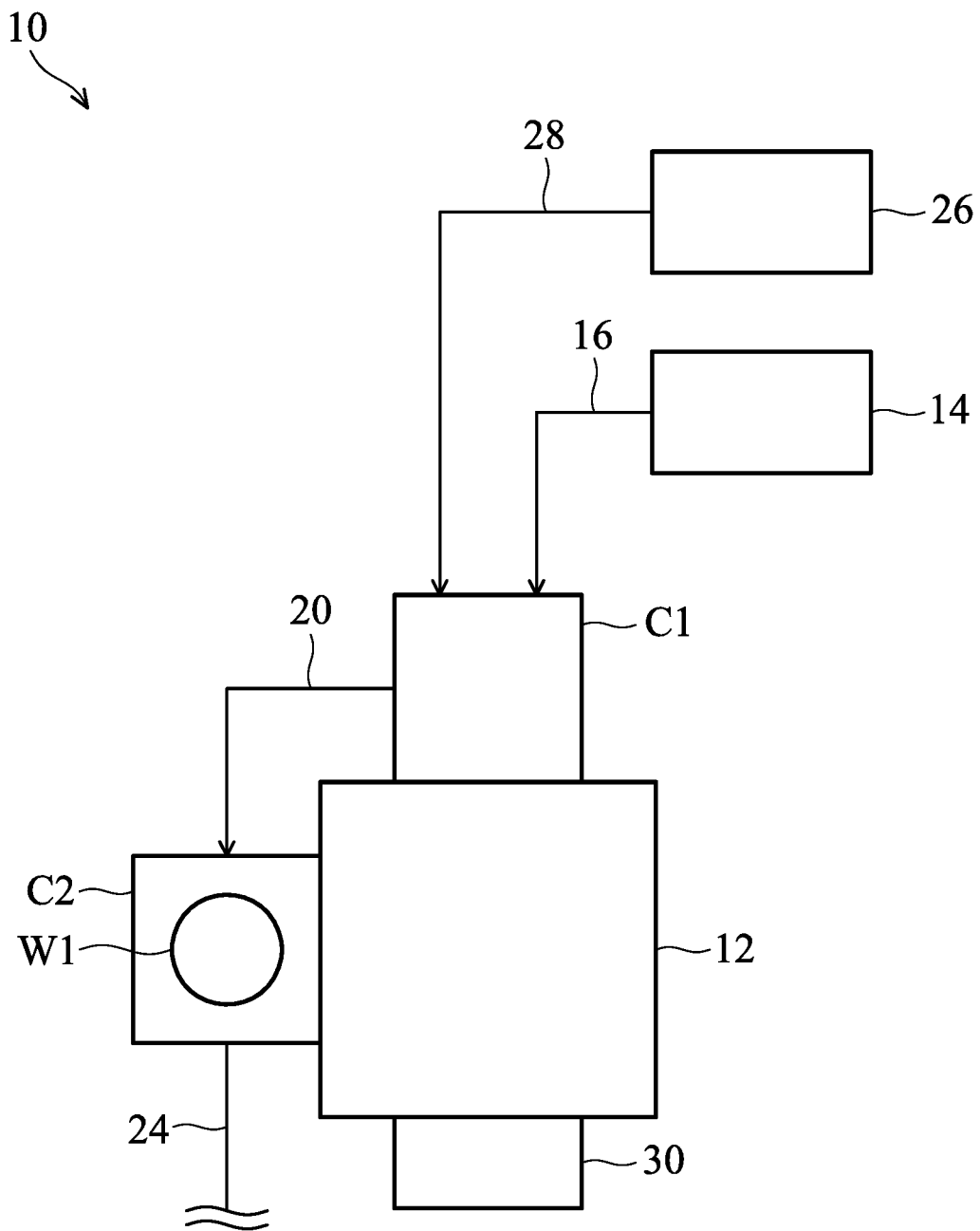
FIGS. 3A-3C are top views of various stages of a process for etching a wafer, in accordance with some embodiments.
Figure 4A:
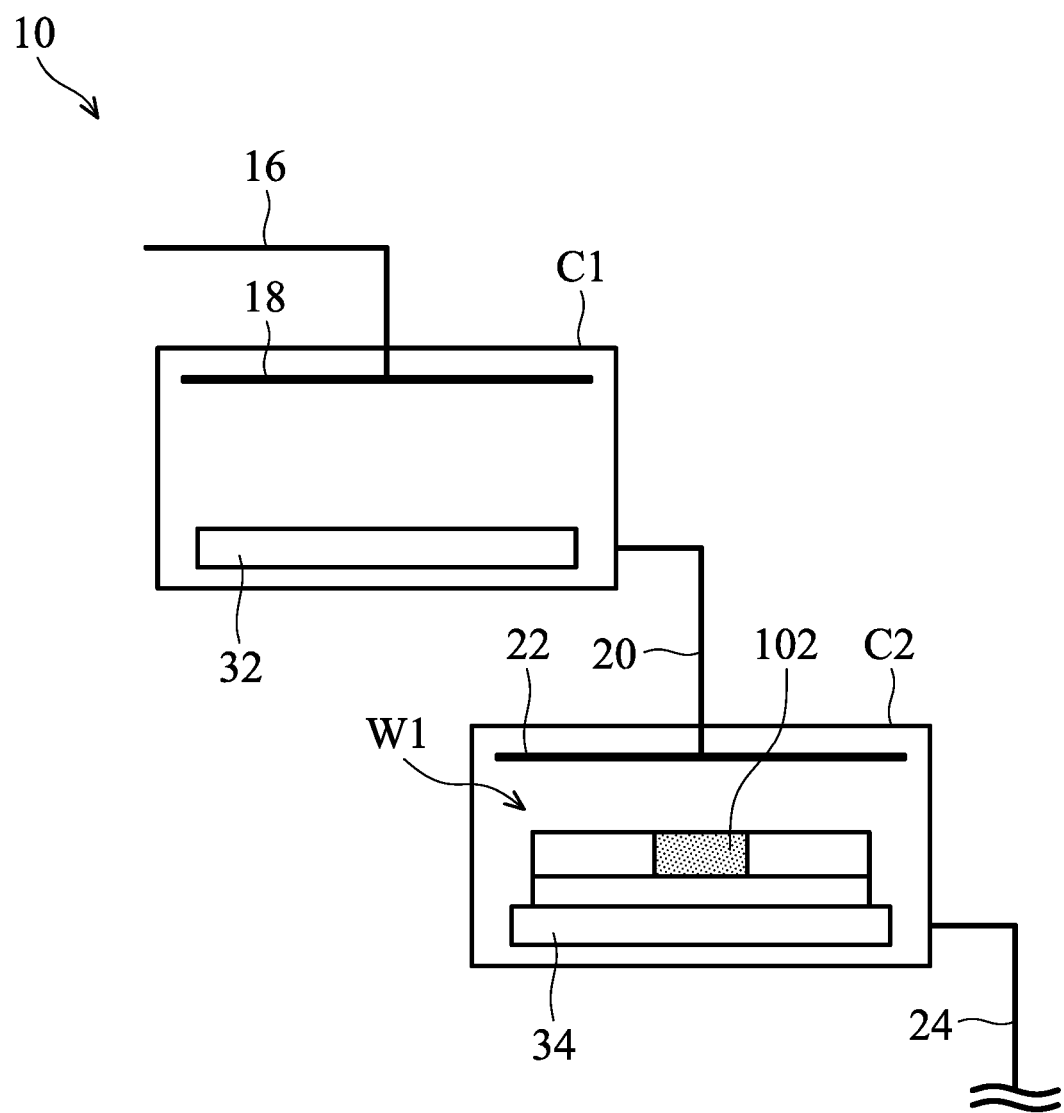
FIGS. 4A-4F are cross-sectional views of various stages of a process for etching a wafer, in accordance with some embodiments.

As shown in FIGS. 3A and 4A, the first wafer W1 is placed into the second chamber C2 and positioned over the chuck 34 in the second chamber C2, in accordance with some embodiments. Afterwards, as shown in FIGS. 3A and 4B, the first etching gas G1 is applied from the first container 14 through the first chamber C1 into the second chamber C2 to etch a portion of the first target material 102 of the first wafer W1, in accordance with some embodiments.

Figure 4B:
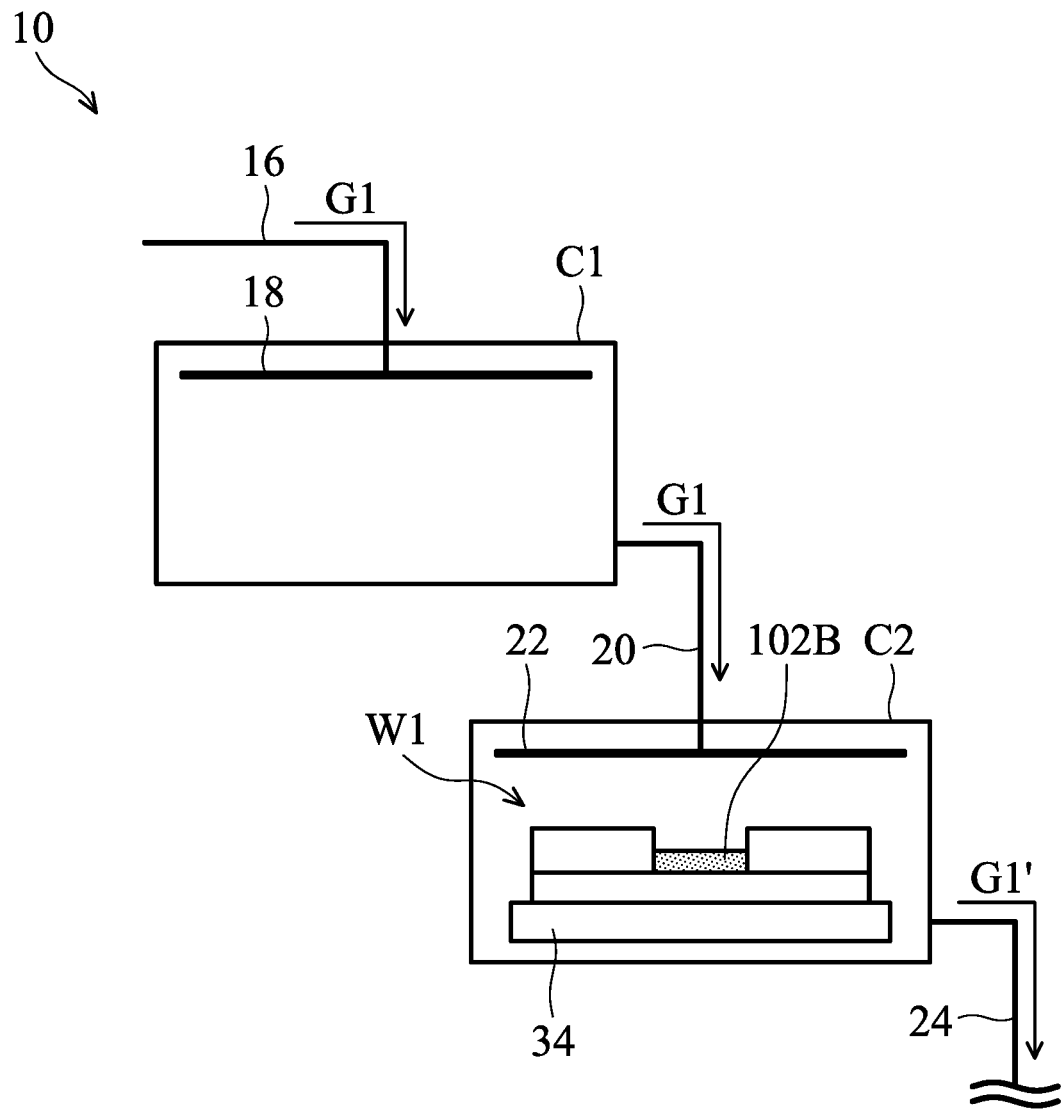

Specifically, as shown in FIGS. 3A and 4B, the first etching gas G1 (or the Xe-containing gaseous etchant in the first etching gas G1) etches the first target material 102 and leaves a remaining portion 102B of the first target material 102, in accordance with some embodiments. In some embodiments, a portion of the first etching gas G1 is reacted with the first target material 102 to produce a byproduct gas such as a gaseous xenon element and gaseous silicon tetrafluoride. In some embodiments, another portion of the first etching gas G1 is unreacted and is referred to as an unreacted portion of the first etching gas G1. Specifically, in some embodiments, a portion of the Xe-containing gaseous etchant in the first etching gas G1 is reacted with the first target material 102. In some embodiments, another portion of the Xe-containing gaseous etchant in the first etching gas G1 is unreacted. In some embodiments, the unreacted portion of the first etching gas G1 is the unreacted portion of Xe-containing gaseous etchant.

In some embodiments, the unreacted portion of the first etching gas G1 and the byproduct gas collectively form a gas G1' and is exhausted through the outlet 24.

Afterwards, in some embodiments, the application of the first etching gas G1 is stopped, and an inert gas is applied to discharge the first etching gas G1 and the gas G1' remaining in the first chamber C1 and the second chamber C2.

Figure 3B:
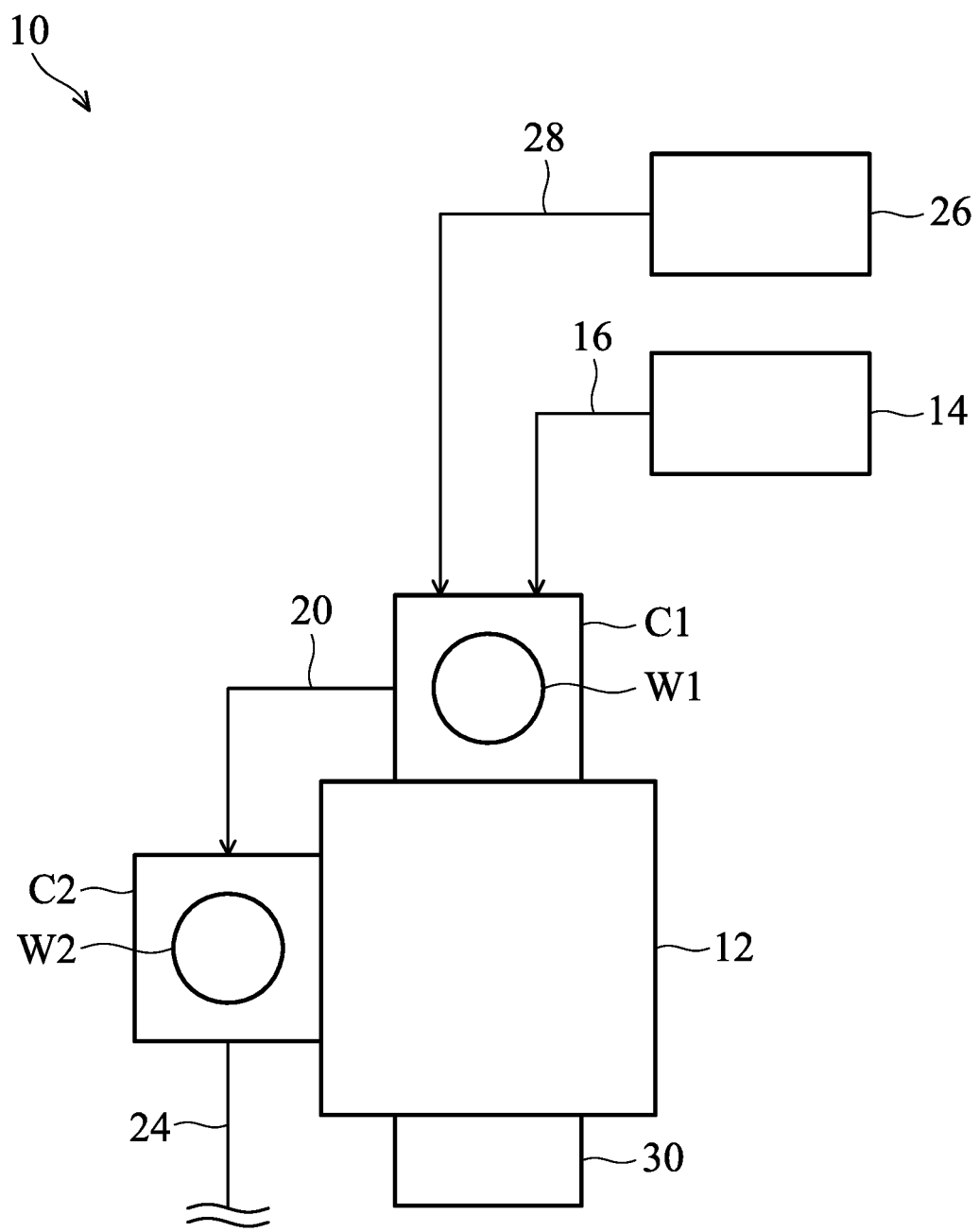
Figure 4C:
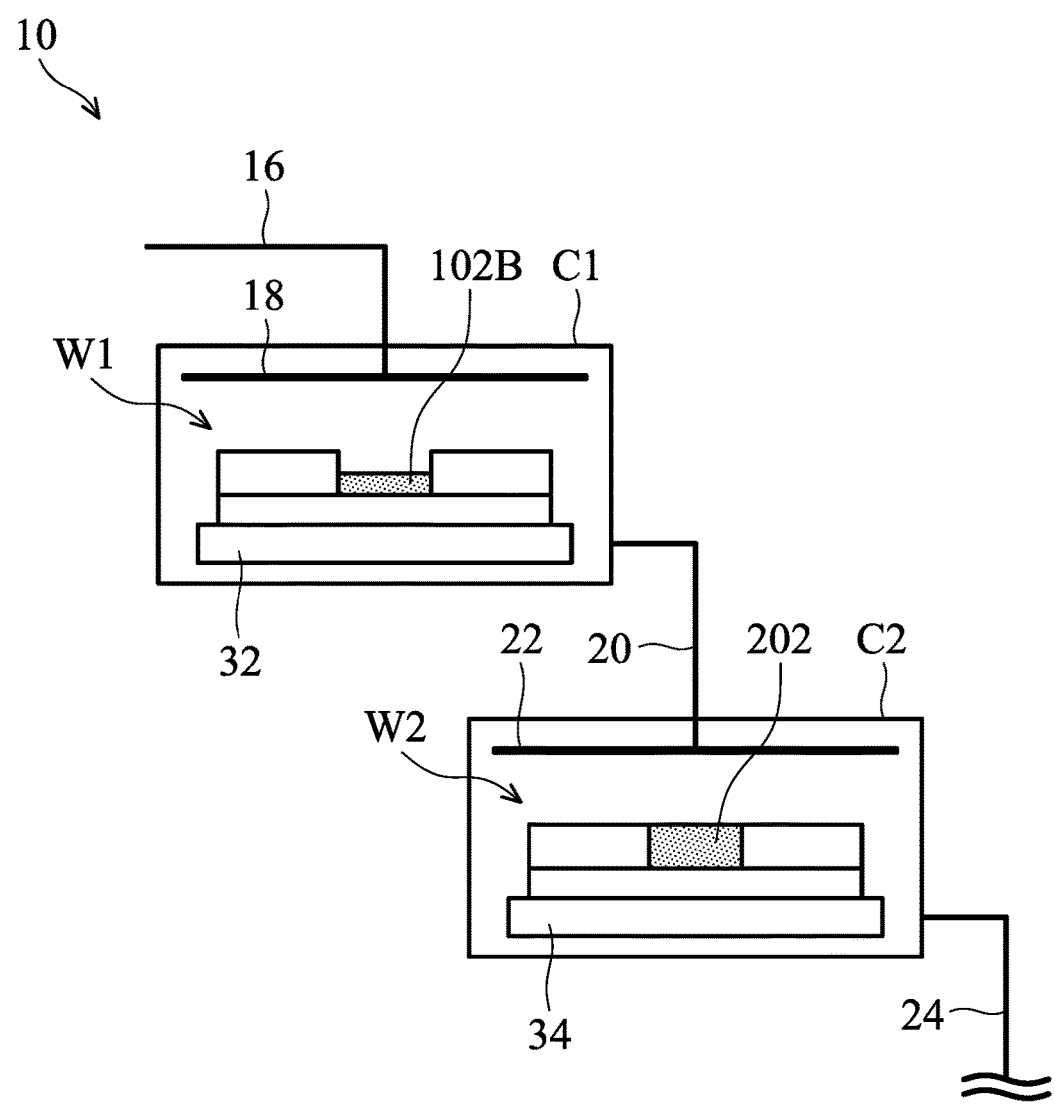

Afterwards, as shown in FIGS. 3B and 4C, the first wafer W1 with the remaining portion 102B is transferred from the second chamber C2 into the first chamber C1 through the transfer port 12, in accordance with some embodiments. As shown in FIGS. 3B and 4C, the first wafer W1 is positioned over the chuck 32 in the first chamber C1, in accordance with some embodiments. Afterwards, as shown in FIGS. 3B and 4C, the second wafer W2 is placed into the second chamber C2 and positioned over the chuck 34 in the second chamber C2, in accordance with some embodiments.

Figure 4D:
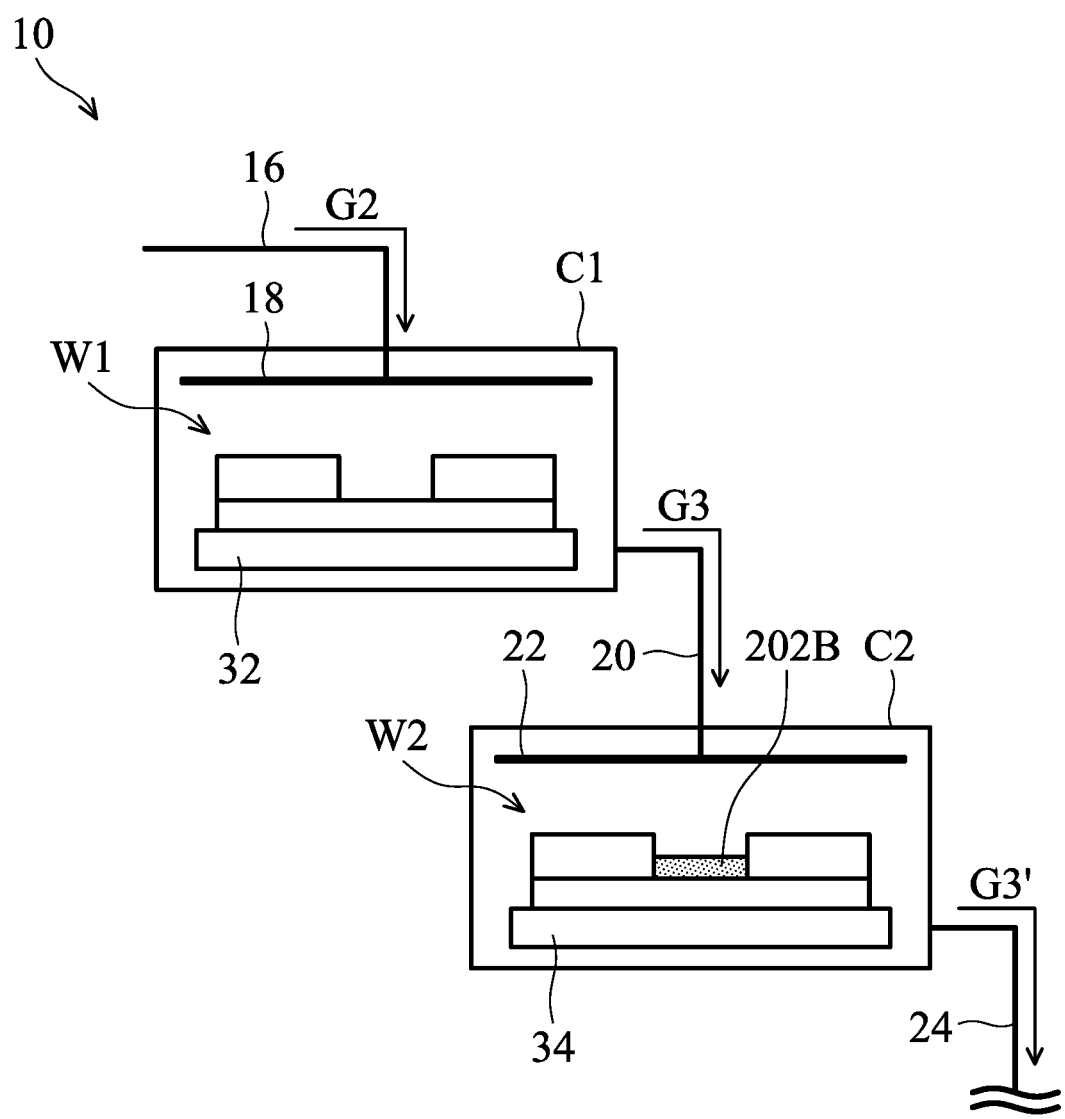

Afterwards, as shown in FIGS. 3B and 4D, a second etching gas G2 is applied from the first container 14 into the first chamber C1 to etch and remove the remaining portion 102B of the first wafer W1, in accordance with some embodiments.

In some embodiments, a portion of the second etching gas G2 is reacted with the remaining portion 102B to produce a byproduct gas. In some embodiments, another portion of the second etching gas G2 is unreacted and is referred to as an unreacted portion of the second etching gas G2. Specifically, in some embodiments, a portion of the Xe-containing gaseous etchant in the second etching gas G2 is reacted with the remaining portion 102B. In some embodiments, another portion of the Xe-containing gaseous etchant in the second etching gas G2 is unreacted. In some embodiments, the unreacted portion of the second etching gas G2 includes the unreacted portion of Xe-containing gaseous etchant in the first chamber C1. In some embodiments, the unreacted portion of the second etching gas G2 is the unreacted portion of Xe-containing gaseous etchant.

In some embodiments, the unreacted portion of the second etching gas G2 and the byproduct gas collectively form a third etching gas G3 with a third concentration of the Xe-containing gaseous etchant which is lower than the second concentration. As shown in FIG. 4D, the third etching gas G3 (i.e. The unreacted portion of the second etching gas G2 and the byproduct gas) is applied from the first chamber C1 into the second chamber C2 through the pipe 20 to etch the second target material 202 of the second wafer W2 and to leave a remaining portion 202B, in accordance with some embodiments.

In some embodiments, after etching the second target material 202 of the second wafer W2, a gas G3' is formed and is exhausted through the outlet 24. In some embodiments, a portion of the third etching gas G3 is reacted with the second target material 202 to produce a byproduct gas, whereas another portion of the third etching gas G3 is unreacted. In some embodiments, the gas G3' is formed by the unreacted portion of the third etching gas G3 and the byproduct gas.

Afterwards, in some embodiments, the application of the second etching gas G2 is stopped, and an inert gas is applied to discharge the second etching gas G2, the third etching gas G3 and the gas G3' remaining in the first chamber C1 and the second chamber C2.

Figure 3C:
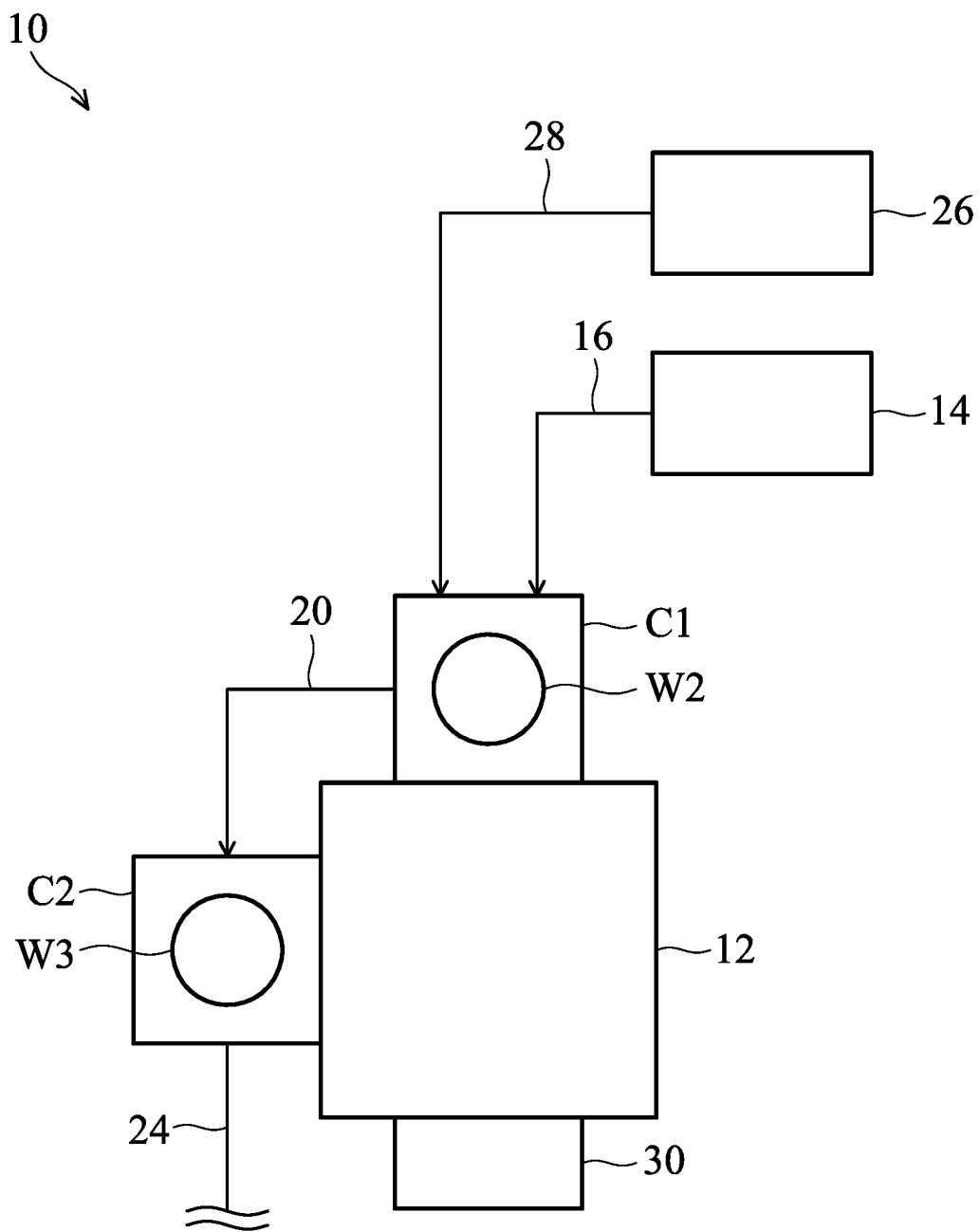
Figure 4E:
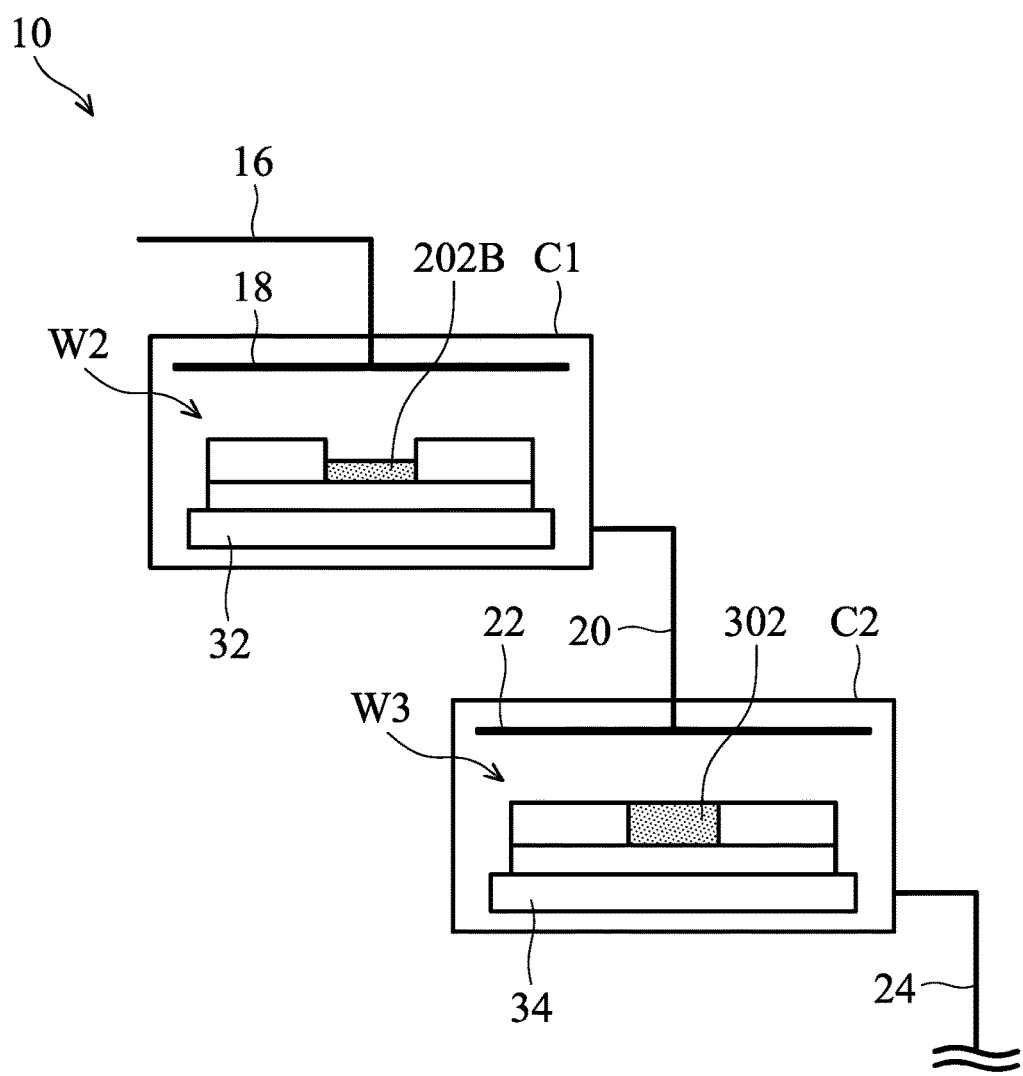

Afterwards, as shown in FIGS. 3C and 4E, the first wafer W1 is transferred out of the first chamber C1, in accordance with some embodiments. As shown in FIGS. 3C and 4E, the second wafer W2 with the remaining portion 202B is transferred from the second chamber C2 into the first chamber C1 through the transfer port 12, in accordance with some embodiments. As shown in FIGS. 3C and 4E, the second wafer W2 is positioned over the chuck 32 in the first chamber C1, in accordance with some embodiments.

As shown in FIGS. 3C and 4E, the third wafer W3 is placed into the second chamber C2 and positioned over the chuck 34 in the second chamber C2, in accordance with some embodiments.

Figure 4F:
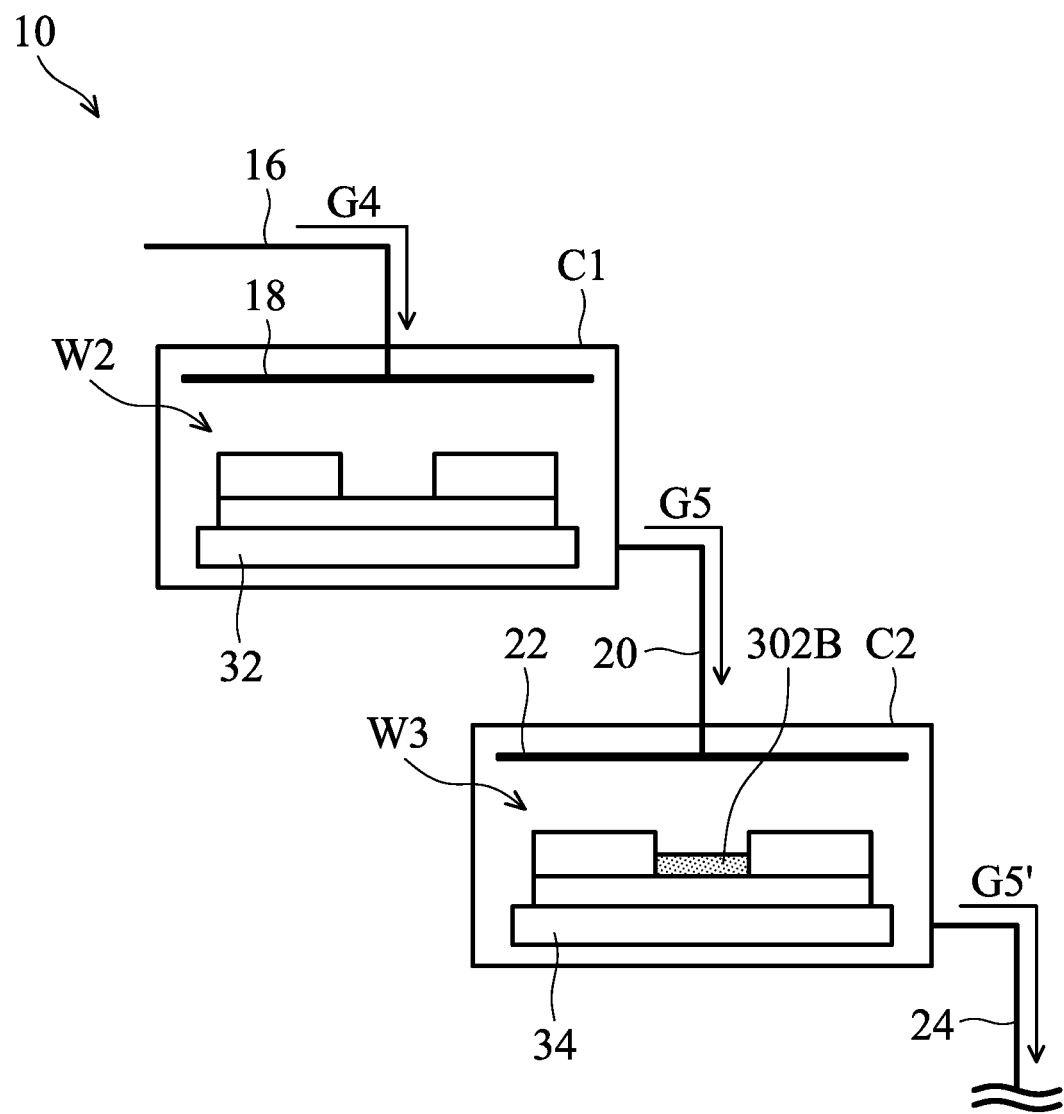

Afterwards, as shown in FIGS. 3C and 4F, a fourth etching gas G4 is applied from the first container 14 into the first chamber C1 to etch and remove the remaining portion 202B of the second wafer W2, in accordance with some embodiments.

In some embodiments, a portion of the fourth etching gas G4 is reacted with the remaining portion 202B of the second wafer W2 to produce a byproduct gas. In some embodiments, another portion of the fourth etching gas G4 is unreacted and is referred to as an unreacted portion of the fourth etching gas G4. Specifically, in some embodiments, a portion of the Xe-containing gaseous etchant in the fourth etching gas G4 is reacted with the remaining portion 202B of the second wafer W2. In some embodiments, another portion of the Xe-containing gaseous etchant in the fourth etching gas G4 is unreacted. In some embodiments, the unreacted portion of the fourth etching gas G4 includes the unreacted portion of Xe-containing gaseous etchant in the first chamber C1. In some embodiments, the unreacted portion of the fourth etching gas G4 is the unreacted portion of Xe-containing gaseous etchant.

In some embodiments, the unreacted portion of the fourth etching gas G4 and the byproduct gas collectively form a fifth etching gas G5 with a fifth concentration of the Xe-containing gaseous etchant which is lower than the fourth concentration. As shown in FIG. 4F, the fifth etching gas G5 (i.e. The unreacted portion of the fourth etching gas G4 and the byproduct gas) is applied from the first chamber C1 into the second chamber C2 through the pipe 20 to etch the third target material 302 of the third wafer W3 and to leave a remaining portion 302B, in accordance with some embodiments.

In some embodiments, after etching the third target material 302 of the third wafer W3, a gas G5' is formed and is exhausted through the outlet 24. In some embodiments, a portion of the fifth etching gas G5 is reacted with the third target material 302 to produce a byproduct gas, whereas another portion of the fifth etching gas G5 is unreacted. In some embodiments, the gas G5' is formed by the unreacted portion of the fifth etching gas G5 and the byproduct gas.

Afterwards, in some embodiments, the application of the fourth etching gas G4 is stopped, and an inert gas is applied from the second container 26 into the first chamber C1 and the second chamber C2 to discharge the fourth etching gas G4, the fifth etching gas G5 and the gas G5' remaining in the first chamber C1 and the second chamber C2.

Afterwards, in some embodiments, the processes mentioned above are repeated to etch other wafers, and the description will not be repeated for the sake of brevity.

The embodiments of the present disclosure are not limited thereto. In some other embodiments of the present disclosure, in the stage shown in FIG. 3A, the second wafer W2 is placed in the first chamber C1. Therefore, in the etching process shown in FIG. 4B, the Xe-containing gaseous etchant is able to etch the second wafer W2 in the first chamber C1 and the first wafer W1 in the second chamber C2 at the same time. Therefore, the utilization efficiency of the Xe-containing gaseous etchant may be further improved, and the manufacturing cost may be reduced further.

It should be noted that the exemplary embodiments set forth in FIGS. 1A-4F are merely for the purpose of illustration. In addition to the embodiments set forth in FIGS. 1A-4F, the apparatus may have three or more chambers as shown in FIGS. 5A-5C and 6A-6F. This will be described in more detail in the following description. Therefore, the present disclosure is not limited to the exemplary embodiments shown in FIGS. 1A-4F.

Figure 5A:
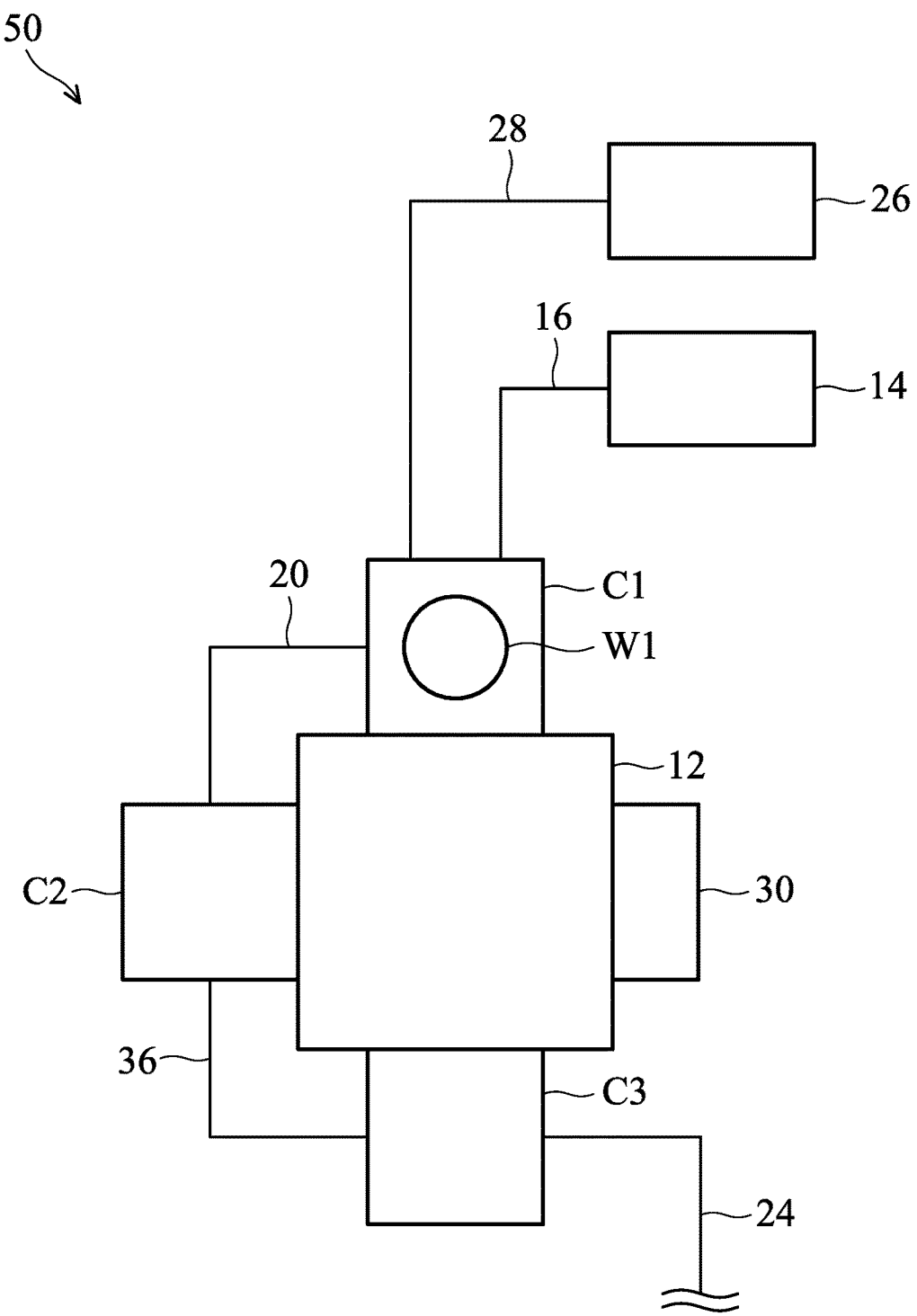
FIGS. 5A-5C are top views of various stages of a process for etching a wafer, in accordance with some embodiments.
Figure 6A:
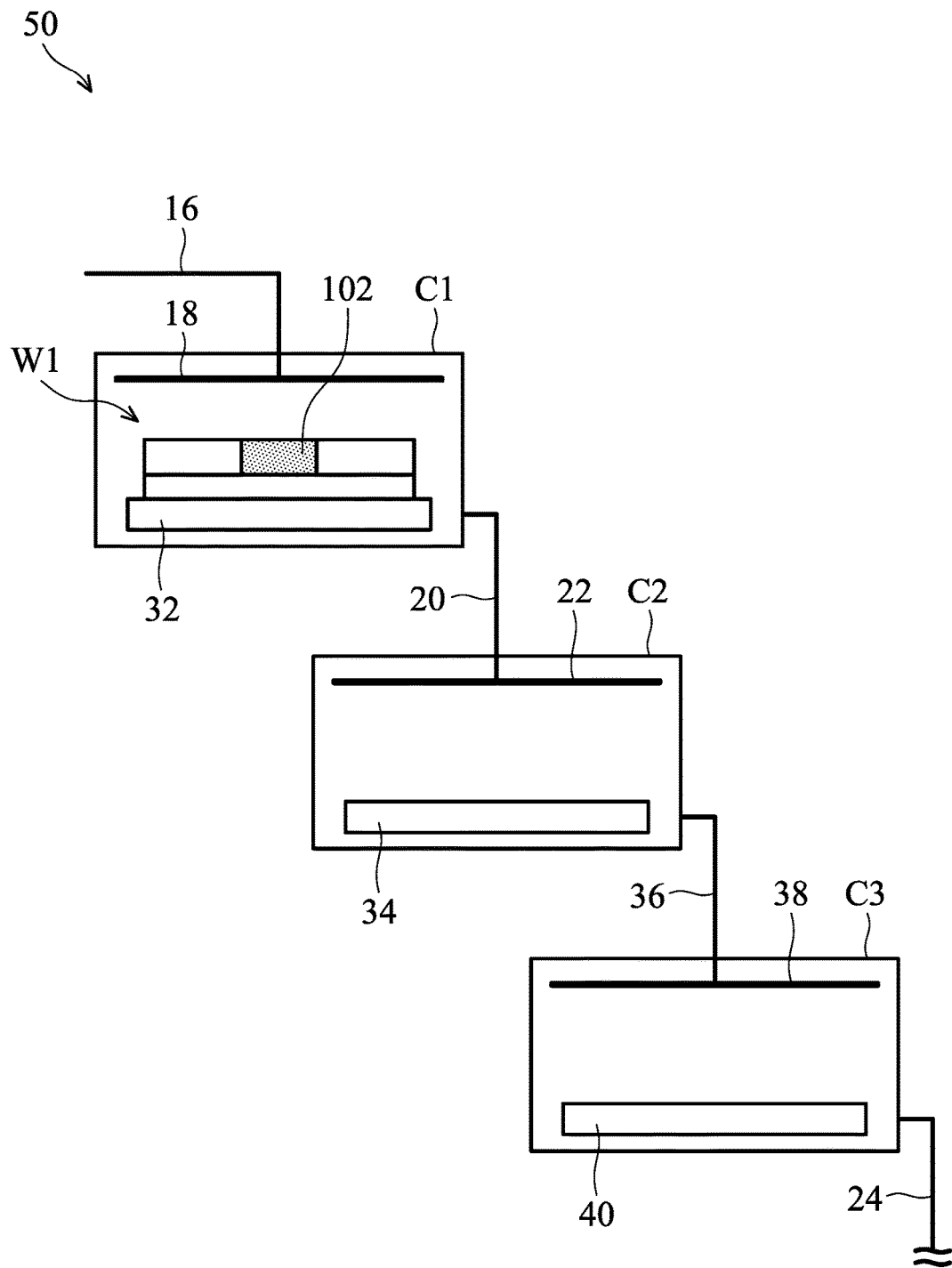
FIGS. 6A-6F are cross-sectional views of various stages of a process for etching a wafer, in accordance with some embodiments.

As shown in FIGS. 5A and 6A, an apparatus 50 is provided, in accordance with some embodiments. As shown in FIGS. 5A and 6A, the difference between the apparatus 50 and the apparatus 10 is that the apparatus 50 further includes a third chamber C3 connecting to the transfer port 12, and a pipe 36 connecting the second chamber C2 to the third chamber C3, in accordance with some embodiments. As shown in FIG. 6A, the pipe 36 is connected to a dispensing head 38 in the third chamber C3, in accordance with some embodiments. As shown in FIG. 6A, the apparatus 10 further includes a chuck 40 in the third chamber C3, in accordance with some embodiments. In some embodiments, the transfer port 12 is configured to transfer wafers between the first chamber C1, the second chamber C2 and the third chamber C3. In addition, as shown in FIGS. 5A and 6A, the outlet 24 is connected to the third chamber C3, in accordance with some embodiments.

In some embodiments, the inlet 16 is configured to receive an etching gas with a fourth concentration from the first container 14 and provide the etching gas into the first chamber C1. In some embodiments, the pipe 20 is configured to output the etching gas with a fifth concentration that is lower than the fourth concentration from the first chamber C1 into the second chamber C2. In some embodiments, the pipe 36 is configured to output the etching gas with a sixth concentration that is lower than the fifth concentration from the second chamber C2 into the third chamber C3. In some embodiments, the outlet 24 is configured to output the etching gas from the third chamber C3.

It should be understood that, although the terms fourth, fifth, sixth etc. may be used herein to describe various concentrations, these concentrations should not be limited by these terms. These terms are only used to distinguish one concentration from another concentration. Therefore, the fourth concentration, the fifth concentration and the sixth concentration discussed above could be termed a first concentration, a second concentration and a third concentration respectively without departing from the teachings of the present disclosure.

As shown in FIGS. 5A and 6A, the first wafer W1 is placed into the first chamber C1 and positioned over the chuck 32 in the first chamber C1, in accordance with some embodiments.

Figure 6B:
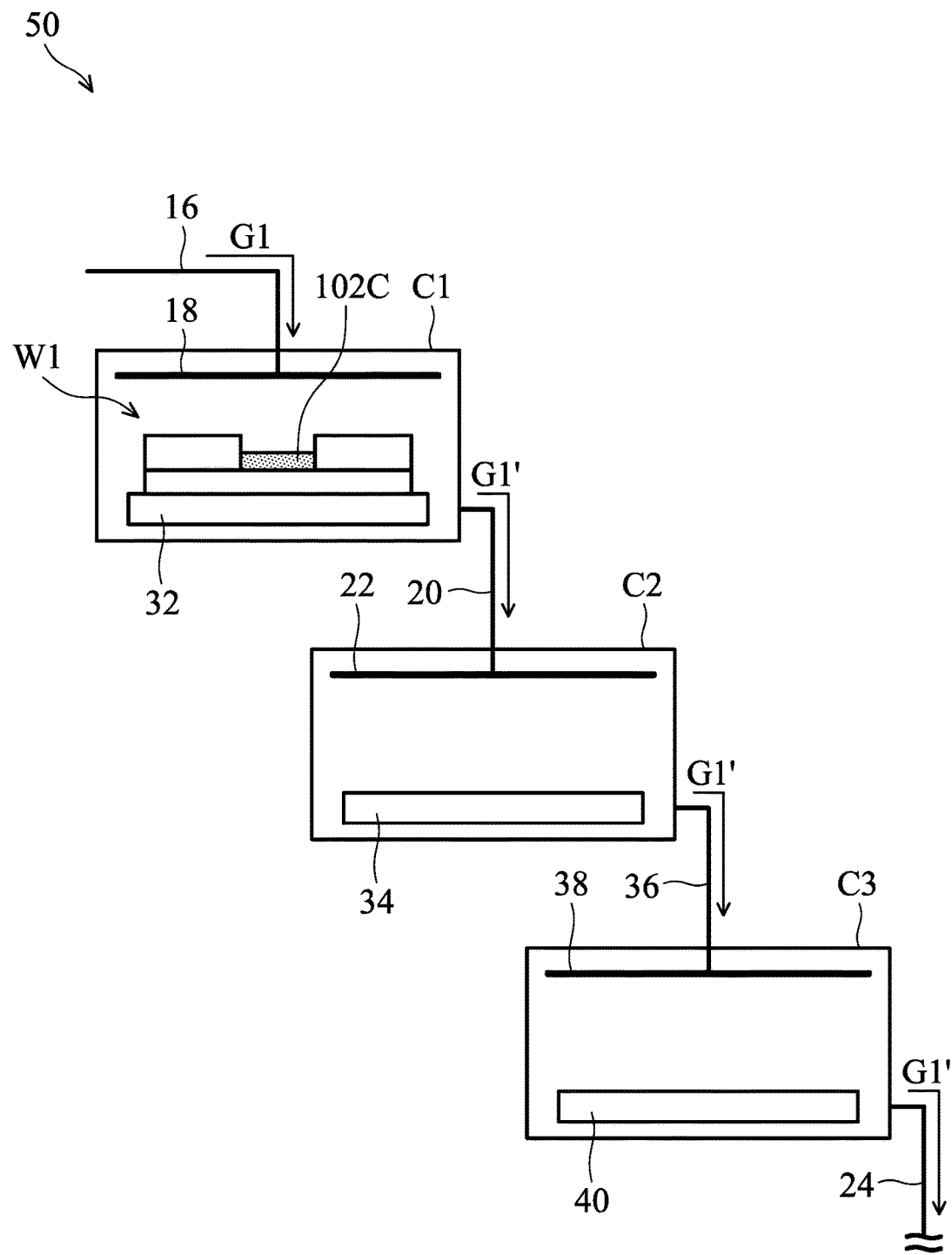

Afterwards, as shown in FIGS. 5A and 6B, a first etching gas G1 is applied from the first container 14 into the first chamber C1 to etch the first target material 102 of the first wafer W1, in accordance with some embodiments.

As shown in FIGS. 5A and 6B, the first etching gas G1 (or the Xe-containing gaseous etchant in the first etching gas G1) etches the first target material 102 and leaves a remaining portion 102C of the first target material 102, in accordance with some embodiments. In some embodiments, a portion of the first etching gas G1 is reacted with the first target material 102 to produce a byproduct gas. In some embodiments, another portion of the first etching gas G1 is unreacted and is referred to as an unreacted portion of the first etching gas G1.

In some embodiments, the unreacted portion of the first etching gas G1 and the byproduct gas collectively form a gas G1' and is exhausted through the pipe 20, the second chamber C2 and the outlet 24.

Afterwards, in some embodiments, the application of the first etching gas G1 is stopped, and an inert gas is applied to discharge the first etching gas G1 and the gas G1' remaining in the first chamber C1 and the second chamber C2.

Figure 5B:
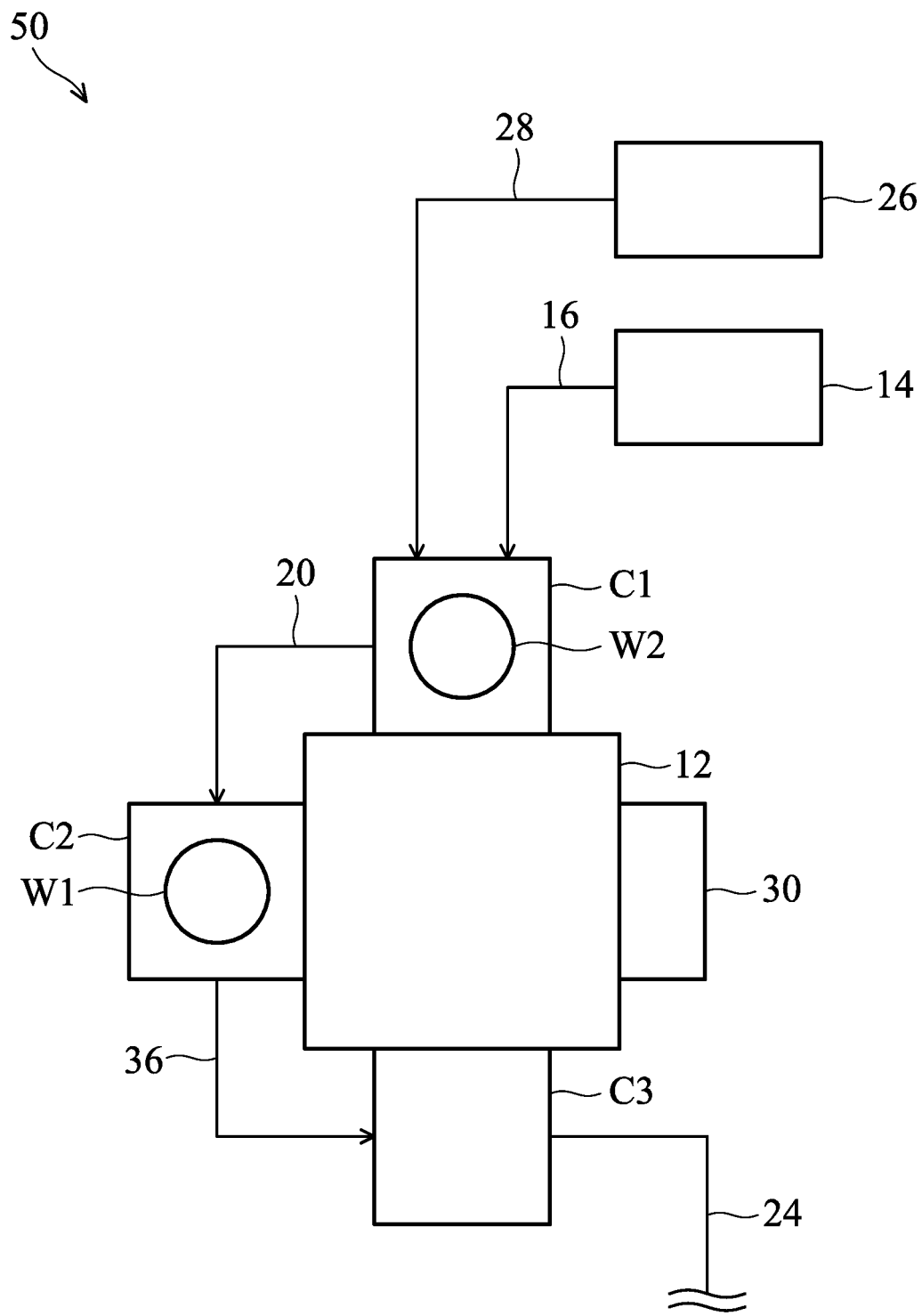
Figure 6C:
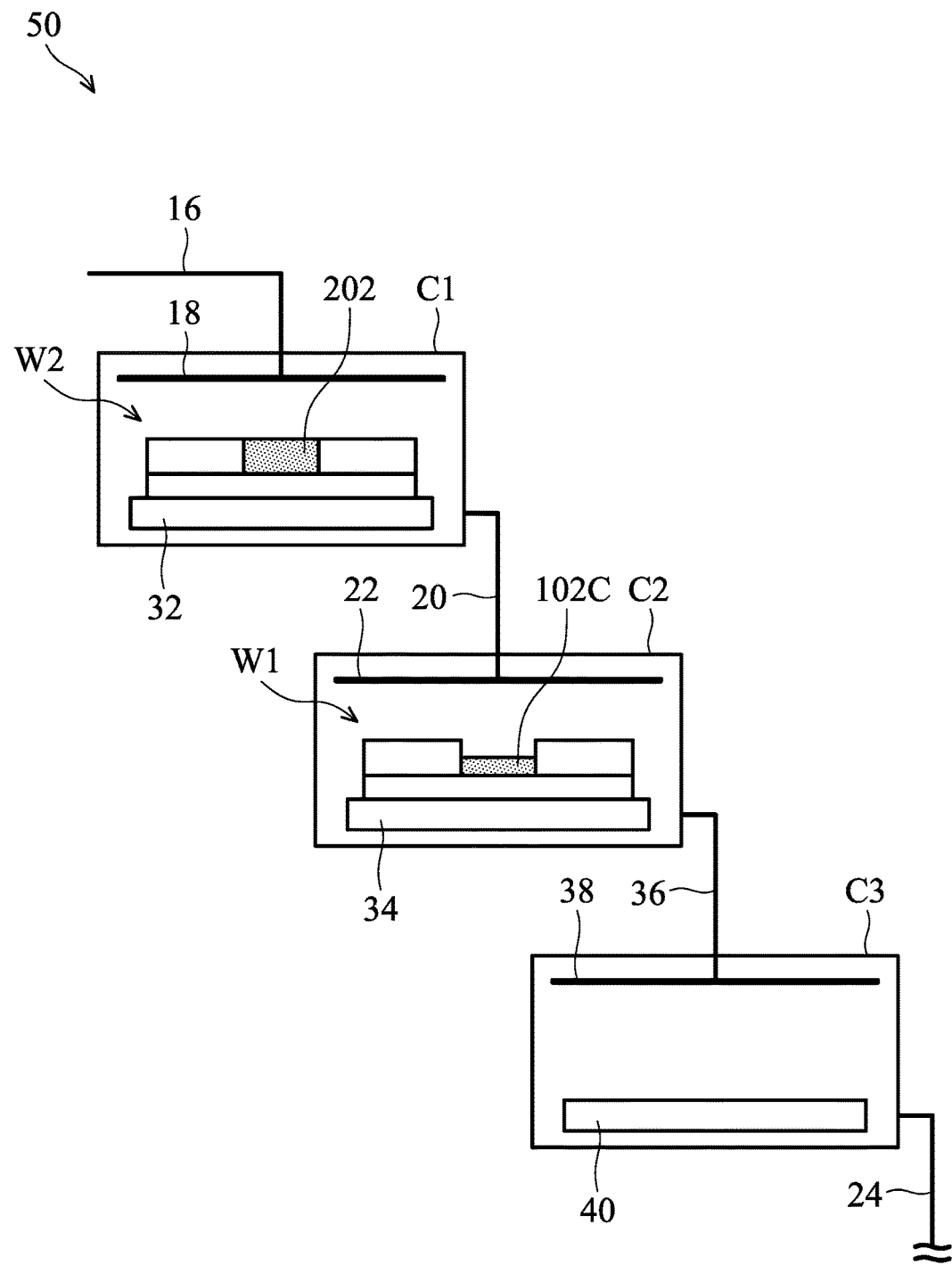

Afterwards, as shown in FIGS. 5B and 6C, the first wafer W1 with the remaining portion 102C is transferred from the first chamber C1 into the second chamber C2 through the transfer port 12, in accordance with some embodiments. As shown in FIGS. 5B and 6C, the first wafer W1 is positioned over the chuck 34 in the second chamber C2, in accordance with some embodiments.

Afterwards, as shown in FIGS. 5B and 6C, the second wafer W2 is placed into the first chamber C1 and positioned over the chuck 32 in the first chamber C1, in accordance with some embodiments.

Figure 6D:
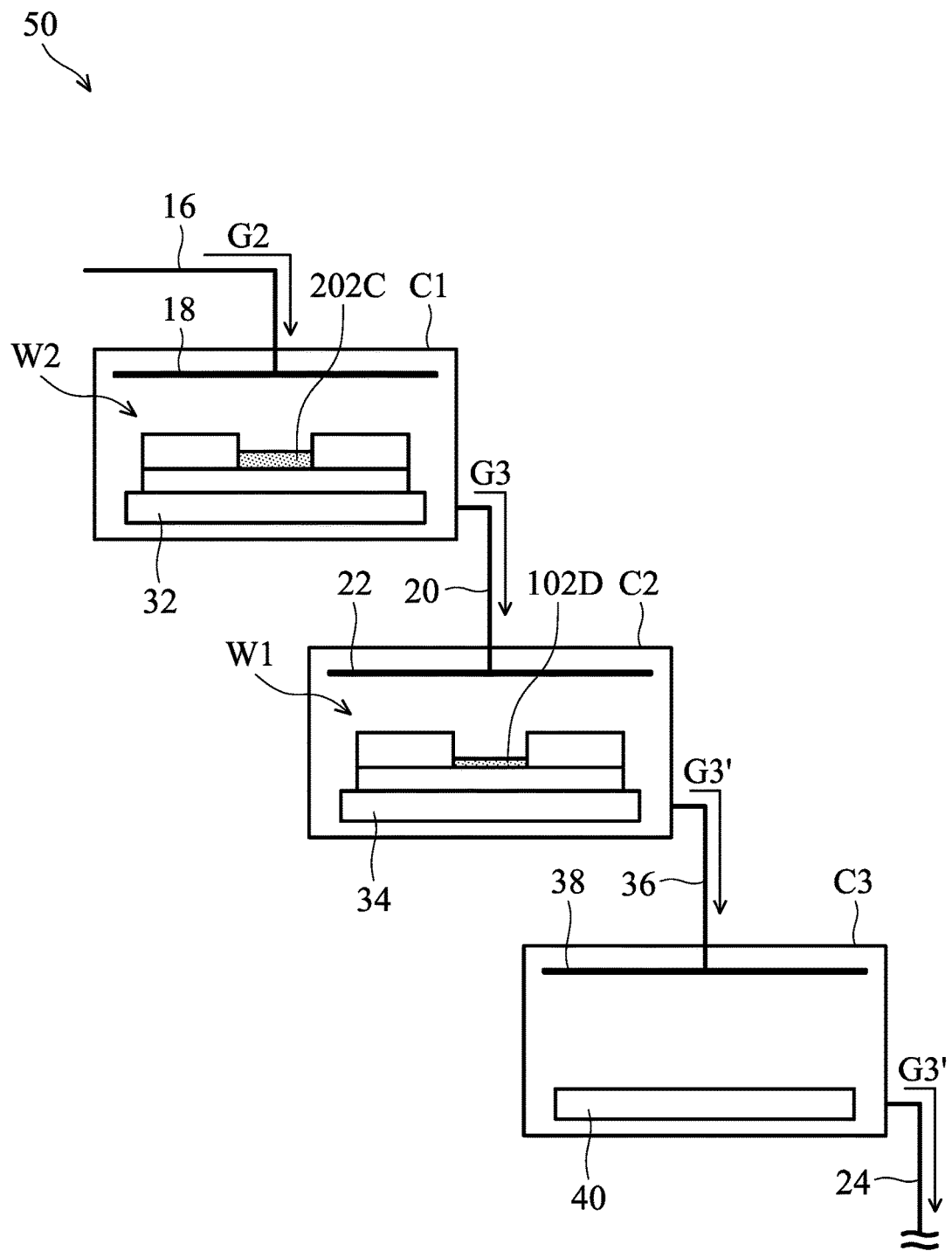

Afterwards, as shown in FIGS. 5B and 6D, a second etching gas G2 is applied from the first container 14 into the first chamber C1 to etch the second target material 202 of the second wafer W2, in accordance with some embodiments.

As shown in FIGS. 5B and 6D, the second etching gas G2 (or the Xe-containing gaseous etchant in the second etching gas G2) etches the second target material 202 and leaves a remaining portion 202C of the second target material 202, in accordance with some embodiments.

In some embodiments, a portion of the second etching gas G2 is reacted with the second target material 202 to produce a first byproduct gas. In some embodiments, another portion of the second etching gas G2 is unreacted and is referred to as an unreacted portion of the second etching gas G2. Specifically, in some embodiments, a portion of the Xe-containing gaseous etchant in the second etching gas G2 is reacted with the second target material 202. In some embodiments, another portion of the Xe-containing gaseous etchant in the second etching gas G2 is unreacted. In some embodiments, the unreacted portion of the second etching gas G2 includes the unreacted portion of Xe-containing gaseous etchant in the first chamber C1. In some embodiments, the unreacted portion of the second etching gas G2 is the unreacted portion of Xe-containing gaseous etchant.

In some embodiments, the unreacted portion of the second etching gas G2 and the first byproduct gas collectively form a third etching gas G3 with a third concentration of the Xe-containing gaseous etchant which is lower than the second concentration. As shown in FIG. 6D, the third etching gas G3 (i.e. The unreacted portion of the second etching gas G2 and the first byproduct gas) is applied from the first chamber C1 into the second chamber C2 through the pipe 20 to etch the remaining portion 102C of the first wafer W1 and leaves a remaining portion 102D of the first target material 102, in accordance with some embodiments.

In some embodiments, after etching the remaining portion 102C of the first wafer W1, a gas G3' is formed and is exhausted through the outlet 24. In some embodiments, a portion of the third etching gas G3 is reacted with the remaining portion 102C to produce a byproduct gas, whereas another portion of the third etching gas G3 is unreacted. In some embodiments, the gas G3' is formed by the unreacted portion of the third etching gas G3 and the byproduct gas.

Afterwards, in some embodiments, the application of the second etching gas G2 is stopped, and an inert gas is applied from the second container 26 into the first chamber C1 and the second chamber C2 to discharge the second etching gas G2, the third etching gas G3 and the gas G3' remaining in the first chamber C1 and the second chamber C2.

Figure 5C:
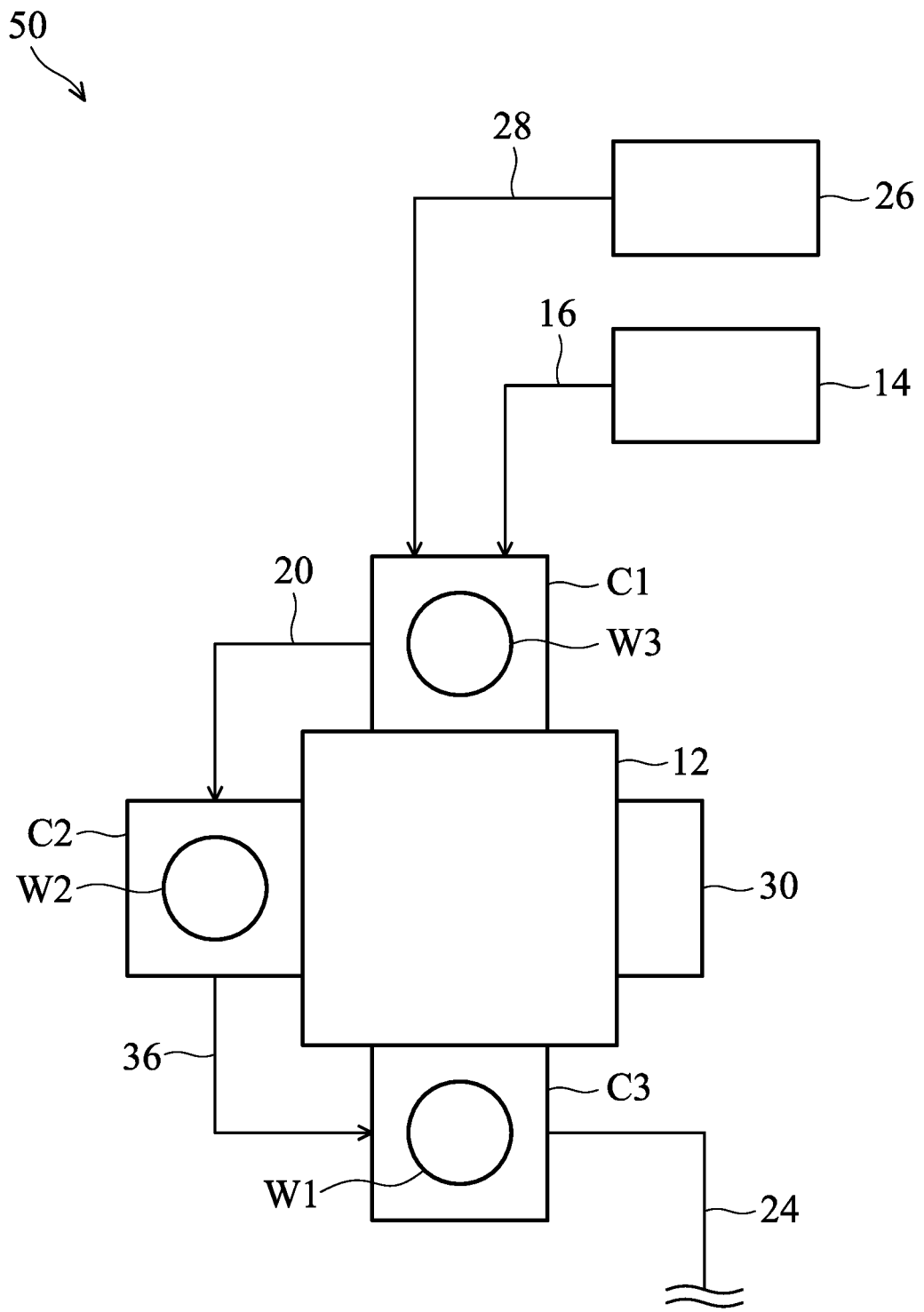
Figure 6E:
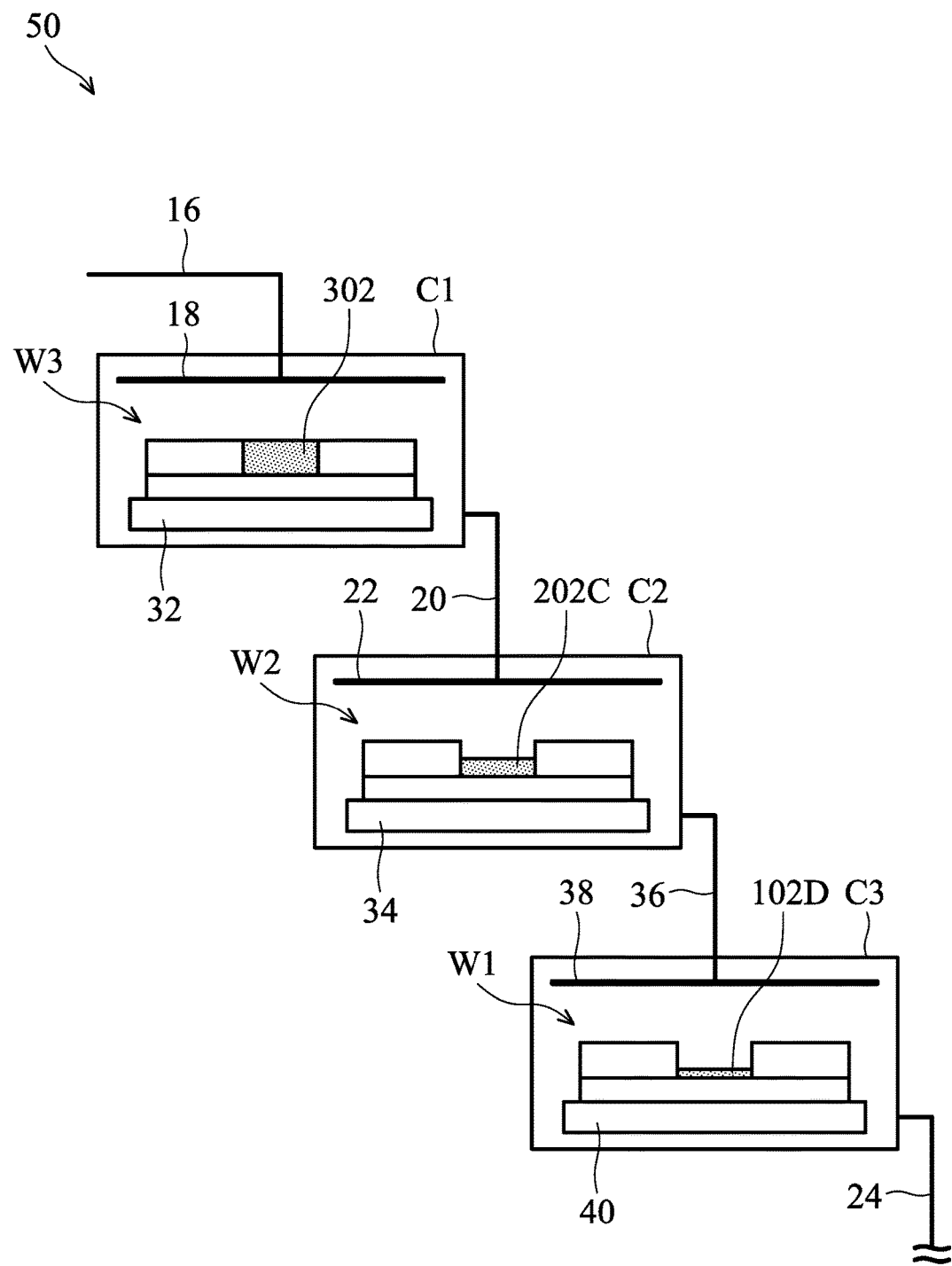

Afterwards, as shown in FIGS. 5C and 6E, the first wafer W1 with the remaining portion 102D is transferred from the second chamber C2 into the third chamber C3 through the transfer port 12, in accordance with some embodiments. As shown in FIGS. 5C and 6E, the first wafer W1 is placed overt the chuck 40 in the third chamber C3, in accordance with some embodiments. As shown in FIGS. 5C and 6E, the second wafer W2 with the remaining portion 202C is transferred from the first chamber C1 into the second chamber C2 through the transfer port 12, in accordance with some embodiments. As shown in FIGS. 5C and 6E, the second wafer W2 is positioned over the chuck 34 in the second chamber C2, in accordance with some embodiments.

Afterwards, as shown in FIGS. 5C and 6E, the third wafer W3 is placed into the first chamber C1 and positioned over the chuck 32 in the first chamber C1, in accordance with some embodiments.

Figure 6F:
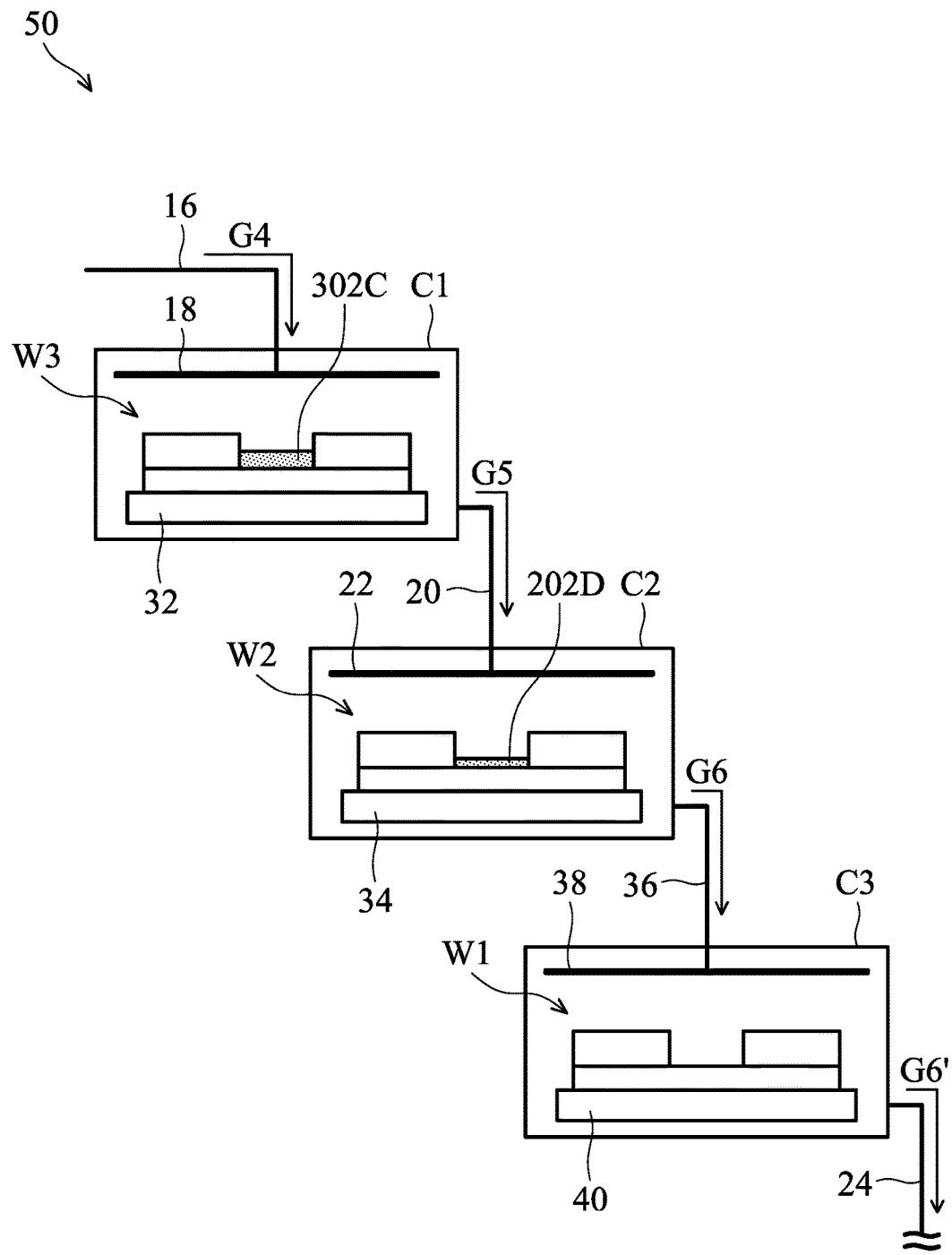

Afterwards, as shown in FIGS. 5C and 6F, a fourth etching gas G4 is applied from the first container 14 into the first chamber C1 to etch the third target material 302 of the third wafer W3 and to leave a remaining portion 302C, in accordance with some embodiments.

In some embodiments, a portion of the fourth etching gas G4 is reacted with the third target material 302 to produce a second byproduct gas. In some embodiments, another portion of the fourth etching gas G4 is unreacted and is referred to as an unreacted portion of the fourth etching gas G4. Specifically, in some embodiments, a portion of the Xe-containing gaseous etchant in the fourth etching gas G4 is reacted with the third target material 302. In some embodiments, another portion of the Xe-containing gaseous etchant in the fourth etching gas G4 is unreacted. In some embodiments, the unreacted portion of the fourth etching gas G4 includes the unreacted portion of Xe-containing gaseous etchant in the first chamber C1. In some embodiments, the unreacted portion of the fourth etching gas G4 is the unreacted portion of Xe-containing gaseous etchant.

In some embodiments, the unreacted portion of the fourth etching gas G4 and the second byproduct gas collectively form a fifth etching gas G5 with a fifth concentration of the Xe-containing gaseous etchant which is lower than the fourth concentration. As shown in FIG. 6F, the fifth etching gas G5 (i.e. The unreacted portion of the fourth etching gas G4 and the second byproduct gas) is applied from the first chamber C1 into the second chamber C2 through the pipe 20 to etch the remaining portion 202C of the second wafer W2 and to leave a remaining portion 202D of the second wafer W2, in accordance with some embodiments.

In some embodiments, a portion of the fifth etching gas G5 is reacted with the remaining portion 202C of the second wafer W2 to produce a third byproduct gas. In some embodiments, another portion of the fifth etching gas G5 is unreacted and is referred to as an unreacted portion of the fifth etching gas G5. Specifically, in some embodiments, a portion of the Xe-containing gaseous etchant in the fifth etching gas G5 is reacted with the remaining portion 202C of the second wafer W2. In some embodiments, another portion of the Xe-containing gaseous etchant in the fifth etching gas G5 is unreacted. In some embodiments, the unreacted portion of the fifth etching gas G5 includes the unreacted portion of Xe-containing gaseous etchant in the second chamber C2.

In some embodiments, the unreacted portion of the fifth etching gas G5 and the third byproduct gas collectively form a sixth etching gas G6 with a sixth concentration of the Xe-containing gaseous etchant which is lower than the fifth concentration. As shown in FIG. 6F, the sixth etching gas G6 (i.e. The unreacted portion of the fifth etching gas G5 and the third byproduct gas) is applied from the second chamber C2 into the third chamber C3 through the pipe 36 to etch and remove the remaining portion 102D of the first wafer W1, in accordance with some embodiments.

In some embodiments, after etching and removing the remaining portion 102D of the first wafer W1, a gas G6' is formed and is exhausted through the outlet 24. In some embodiments, a portion of the sixth etching gas G5 is reacted with the remaining portion 102D to produce a byproduct gas, whereas another portion of the sixth etching gas G5 is unreacted. In some embodiments, the gas G6' is formed by the unreacted portion of the sixth etching gas G5 and the byproduct gas.

Afterwards, in some embodiments, the application of the fourth etching gas G4 is stopped, and an inert gas is applied from the second container 26 into the first chamber C1 and the second chamber C2 to discharge the fourth etching gas G4, the fifth etching gas G5, the sixth etching gas G6 and the gas G6' remaining in the first chamber C1, the second chamber C2 and the third chamber C3. Afterwards, in some embodiments, the processes mentioned above are repeated to etch other wafers, and the description will not be repeated for the sake of brevity.

Embodiments of the disclosure use an apparatus including two or more chambers (for example, the first chamber, the second chamber and/or the third chamber) for etching wafers. In some embodiments, the unreacted portion of the Xe-containing gaseous etchant in the first chamber can be used to etch the wafer in the second chamber instead of being directly exhausted. Therefore, the utilization efficiency of the Xe-containing gaseous etchant may be improved, and the amount of wafer manufactured per hour may also be increased. In addition, the manufacturing cost may be reduced.

In accordance with some embodiments, a method for etching a wafer is provided. The method includes placing a first wafer with a first target material into a first chamber, and placing a second wafer with a second target material into a second chamber. The second chamber is connected to the first chamber by a first pipe. The method also includes applying a first Xe-containing gaseous etchant into the first chamber to etch the first target material. A portion of the first Xe-containing gaseous etchant in the first chamber is unreacted during the etching of the first target material. The method further includes applying the unreacted portion of the first Xe-containing gaseous etchant from the first chamber into the second chamber through the first pipe to etch the second target material of the second wafer.

In accordance with some embodiments, a method for etching a wafer is provided. The method includes placing a first wafer with a first target material into a first chamber, and applying a first etching gas into the first chamber to etch the first target material and to leave a first remaining portion of the first target material. The first etching gas has a first concentration of a Xe-containing gaseous etchant. The method also includes transferring the first wafer from the first chamber into a second chamber. The first chamber is connected to the second chamber by a first pipe. The method further includes placing a second wafer with a second target material into the first chamber, and applying a second etching gas with a second concentration of the Xe-containing gaseous etchant into the first chamber to etch the second target material. A portion of the second etching gas is reacted with the second target material to produce a first byproduct gas, whereas another portion of the second etching gas is unreacted. The method also includes applying the unreacted portion of the second etching gas and the first byproduct gas from the first chamber into the second chamber through the first pipe to etch the first remaining portion of the first wafer. The unreacted portion of the second etching gas and the first byproduct gas serve as a third etching gas with a third concentration of the Xe-containing gaseous etchant which is lower than the second concentration.

In accordance with some embodiments, an apparatus is provided. The apparatus includes a first chamber, a second chamber, and a transfer port. The first chamber and the second chamber are connected to the transfer port, and the transfer port is configured to transfers wafers between the first chamber and the second chamber. The apparatus also includes an inlet connecting to the first chamber. The inlet is configured to receive an etching gas with a first concentration from a first container and provide the etching gas into the first chamber. The apparatus further includes a first pipe connecting the first chamber to the second chamber. The first pipe is configured to output the etching gas with a second concentration that is lower than the first concentration from the first chamber into the second chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for etching a wafer, comprising:
   placing a first wafer with a first target material into a first chamber;
   placing a second wafer with a second target material into a second chamber, wherein the second chamber is connected to the first chamber by a first pipe;
   applying a first Xe-containing gaseous etchant into the first chamber to etch the first target material, wherein a portion of the first Xe-containing gaseous etchant in the first chamber is unreacted during the etching of the first target material; and
   applying the unreacted portion of the first Xe-containing gaseous etchant from the first chamber into the second chamber through the first pipe to etch the second target material of the second wafer.

2. The method as claimed in claim 1, wherein the first target material and the second target material are independently made of poly-silicon, monolithic silicon, amorphous silicon, or a combination thereof.

3. The method as claimed in claim 1, wherein the etching process which etches the second target material by applying the first Xe-containing gaseous etchant leaves a second remaining portion of the second target material, wherein the method further comprises:
   transferring the first wafer out of the first chamber;
   transferring the second wafer from the second chamber into the first chamber; and
   placing a third wafer with a third target material into the second chamber.

4. The method as claimed in claim 3, further comprising:
   applying a second Xe-containing gaseous etchant into the first chamber to etch the second remaining portion of the second target material of the second wafer,
   wherein a portion of the second Xe-containing gaseous etchant in the first chamber is unreacted during the etching of the second remaining portion of the second target material of the second wafer and is applied from the first chamber into the second chamber through the first pipe to etch the third target material.

5. The method as claimed in claim 4, wherein the first Xe-containing gaseous etchant and the second Xe-containing gaseous etchant comprise $XeF_2$, $XeF_4$, $XeF_6$, or a combination thereof.

6. The method as claimed in claim 4, wherein a material of the first Xe-containing gaseous etchant is the same as that of the second Xe-containing gaseous etchant.

7. The method as claimed in claim 1, wherein before applying the first Xe-containing gaseous etchant, the method further comprises:
   placing the first wafer into the second chamber; and etching a portion of the first target material of the first wafer by applying a third Xe-containing gaseous etchant into the second chamber.

8. The method as claimed in claim 7, wherein a material of the third Xe-containing gaseous etchant is the same as that of the first Xe-containing gaseous etchant.

9. A method for etching a wafer, comprising:
placing a first wafer with a first target material into a first chamber;
applying a first etching gas into the first chamber to etch the first target material and to leave a first remaining portion of the first target material, wherein the first etching gas has a first concentration of a Xe-containing gaseous etchant;
transferring the first wafer from the first chamber into a second chamber, wherein the first chamber is connected to the second chamber by a first pipe;
placing a second wafer with a second target material into the first chamber;
applying a second etching gas with a second concentration of the Xe-containing gaseous etchant into the first chamber to etch the second target material, wherein a portion of the second etching gas is reacted with the second target material to produce a first byproduct gas, whereas another portion of the second etching gas is unreacted; and
applying the unreacted portion of the second etching gas and the first byproduct gas from the first chamber into the second chamber through the first pipe to etch the first remaining portion of the first wafer,
wherein the unreacted portion of the second etching gas and the first byproduct gas serve as a third etching gas with a third concentration of the Xe-containing gaseous etchant which is lower than the second concentration.

10. The method as claimed in claim 9, wherein the etching process which etches the second target material by applying the second etching gas leaves a second remaining portion of the second target material.

11. The method as claimed in claim 10, wherein the etching process which etches first remaining portion of the first target material by applying the third etching gas leaves a third remaining portion of the first target material.

12. The method as claimed in claim 11, wherein after applying the third etching gas, the method further comprises:
transferring the first wafer with the third remaining portion from the second chamber into a third chamber, wherein the third chamber is connected to the second chamber by a second pipe;
transferring the second wafer with the second remaining portion from the first chamber into the second chamber; and
placing a third wafer with a third target material into the first chamber.

13. The method as claimed in claim 12, further comprising:
applying a fourth etching gas with a fourth concentration of the Xe-containing gaseous etchant into the first chamber to etch the third target material, wherein a portion of the fourth etching gas is reacted with the third target material to produce a second byproduct gas, whereas another portion of the fourth etching gas is unreacted; and
applying the unreacted portion of the fourth etching gas and the second byproduct gas from the first chamber into the second chamber through the first pipe to etch the second remaining portion of the second wafer,
wherein the unreacted portion of the fourth etching gas and the second byproduct gas serve as a fifth etching gas with a fifth concentration of the Xe-containing gaseous etchant which is lower than the fourth concentration.

14. The method as claimed in claim 13, wherein a portion of the fifth etching gas is reacted with the second remaining portion of the second target material to produce a third byproduct gas, whereas another portion of the fifth etching gas is unreacted, wherein the method further comprises:
applying the unreacted portion of the fifth etching gas and the third byproduct gas from the second chamber into the third chamber through the second pipe to etch the third remaining portion of the first wafer.

15. The method as claimed in claim 9, wherein the Xe-containing gaseous etchant comprises $XeF_2$, $XeF_4$, $XeF_6$, or a combination thereof.

16. The method as claimed in claim 14, wherein the first byproduct gas, the second byproduct gas and the third byproduct gas independently comprise a gaseous xenon element and gaseous silicon tetrafluoride.

17. A method for etching a wafer, comprising:
placing a first wafer in a first chamber and a second wafer in a second chamber, wherein the second chamber is connected to the first chamber by a first pipe;
reacting a first target material in the first wafer with a first Xe-containing gaseous etchant in the first chamber;
transferring the first Xe-containing gaseous etchant from the first chamber into the second chamber through the first pipe to etch a second target material in the second wafer;
transferring the first wafer from the first chamber into the second chamber; and
placing a third wafer in the first chamber.

18. The method as claimed in claim 17, wherein a first portion of the first Xe-containing gaseous etchant reacts with the first target material to produce a byproduct gas, and the byproduct gas is transferred from the first chamber into the second chamber.

19. The method as claimed in claim 18, wherein after etching the first target material in the first chamber, a portion of the first target material does not react with the first Xe-containing gaseous etchant.

20. The method as claimed in claim 19, further comprising:
before placing the third wafer in the first chamber, discharging the first Xe-containing gaseous etchant and the byproduct gas by applying an inert gas into the first chamber and the second chamber; and
etching a third target material in the third wafer and the portion of the first target material by a second Xe-containing gaseous etchant.

* * * * *